United States Patent [19]
Hieda et al.

[11] Patent Number: 6,015,990
[45] Date of Patent: Jan. 18, 2000

[54] SEMICONDUCTOR MEMORY DEVICE AND METHOD OF MANUFACTURING THE SAME

[75] Inventors: Katsuhiko Hieda, Yokohama; Tsunetoshi Arikado, Tokyo; Katsuya Okumura, Yokohama, all of Japan

[73] Assignee: Kabushiki Kaisha Toshiba, Kawasaki, Japan

[21] Appl. No.: 09/030,809

[22] Filed: Feb. 26, 1998

[30] Foreign Application Priority Data

Feb. 27, 1997 [JP] Japan ...................................... 9-044009
Feb. 25, 1998 [JP] Japan .................................... 10-043657

[51] Int. Cl.$^7$ .......................... H01L 27/108; H01L 29/94
[52] U.S. Cl. ........................... 257/310; 257/295; 257/301
[58] Field of Search ................................... 257/295, 296, 257/301, 310

[56] References Cited

U.S. PATENT DOCUMENTS

| | | | |
|---|---|---|---|
| 4,409,608 | 10/1983 | Yoder | 257/534 |
| 4,536,785 | 8/1985 | Gibbons | 257/71 |
| 5,341,016 | 8/1994 | Prall et al. | 257/412 |
| 5,889,299 | 3/1999 | Abe et al. | 257/295 |

FOREIGN PATENT DOCUMENTS

| | | |
|---|---|---|
| 8-139292 | 5/1996 | Japan . |
| 8-195328 | 7/1996 | Japan . |

*Primary Examiner*—Mahshid Saadat
*Assistant Examiner*—George C. Eckert, II
*Attorney, Agent, or Firm*—Finnegan, Henderson, Farabow, Garrett & Dunner, L.L.P.

[57] ABSTRACT

A semiconductor memory device comprises a matrix of memory cells, each having a transistor and a capacitor. A first electrode, a dielectric film and a second electrode are sequentially staked on a silicon monocrystalline substrate and epitaxially grown to form a capacitor having a multi-layer structure. Then, an SOI layer is formed on the monocrystalline substrate carrying thereon the capacitor with an insulator film interposed therebetween. A source/drain diffusion layer is formed in the SOI layer and a gate electrode is formed to produce a MOS transistor. Either the source or the drain of the source/drain diffusion layer of the transistor is connected to the second electrode by way of the polysilicon layer in the contact hole running through the SOI layer and the insulator film layer.

14 Claims, 10 Drawing Sheets

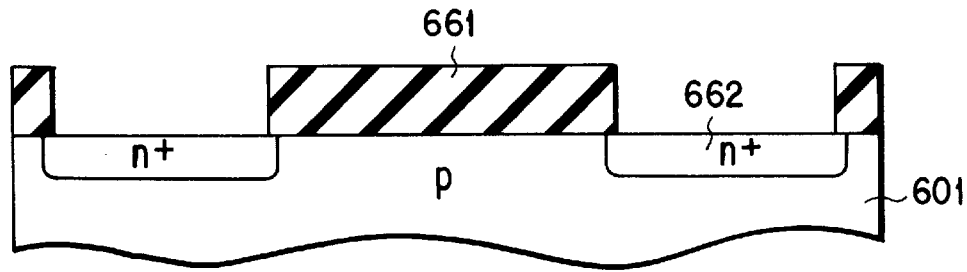
F I G. 11A
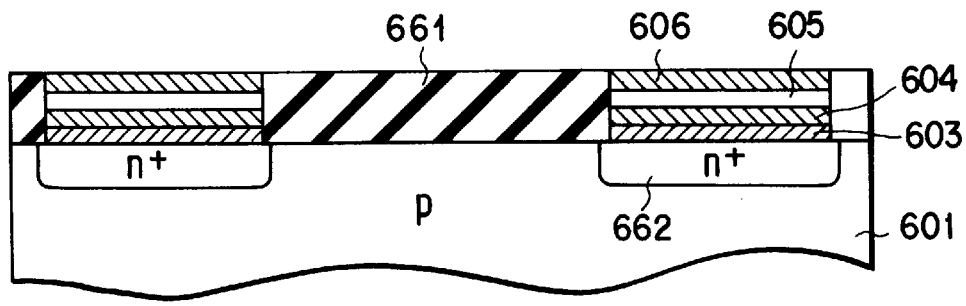
F I G. 11B
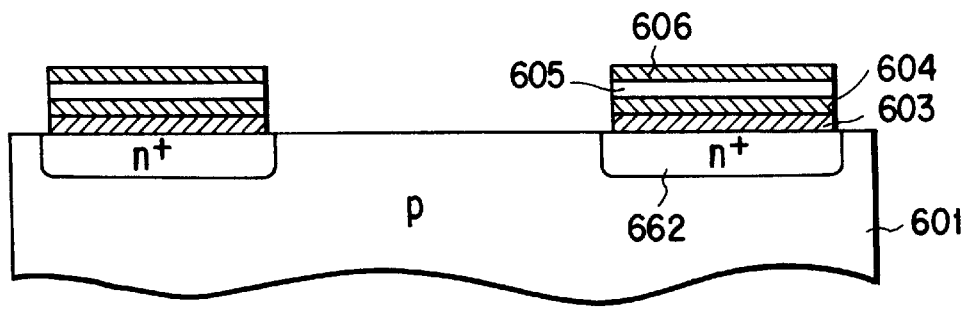
F I G. 11C
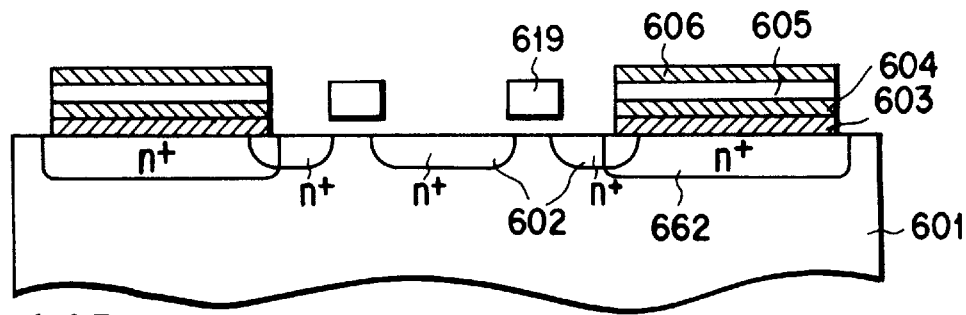
F I G. 11D

SEMICONDUCTOR MEMORY DEVICE AND METHOD OF MANUFACTURING THE SAME

BACKGROUND OF THE INVENTION

This invention relates to a semiconductor memory device having the memory cells comprised of transistors and capacitors. More particularly, it relates to a semiconductor memory device prepared by using high dielectric film or ferroelectric film for the capacitor insulator film of the device.

Known dynamic random access memories (DRAMs) having the memory cells comprised of transistors and capacitors of the type under consideration have paved the way to a higher degree of integration mainly by down-sizing through micronization. However, as the trend of micronization goes on, the surface area available to capacitors is reduced and, nowadays, capacitors are arranged three-dimensionally in a memory device and the lateral sides of the device are used to secure the capacity required for storing data. The process of manufacturing three-dimensionally arranged capacitors such as those referred to as trench type or stack type is a long and tedious one and consequently involves high manufacturing cost. It is a serious concern of the industry that capacitors as small as 0.1 μm, if produced in the near future and arranged three-dimensionally, may not be able to secure the storage capacity required for the memory cells comprising them.

In line with the problem of securing a necessary memory capacity, it is expected that large capacity DRAMs such as 4G/16G-bit memory devices that may appear in the future may not be able to realize a short refresh cycle of the currently available level. More specifically, since DRAMs are adapted to store data in terms of stored electric charge $Q(Q=C \times V$ where C is the capacitance of the capacitor and V is the voltage applied to the capacitor), the capacitor area is inevitably reduced to make it difficult to secure the stored electric charge required for the capacitors to operate as the device is micronized. Therefore, there is a strong demand for a new memory device/new material that can secure a requisite volume of information (that correspond to a requisite stored electric charge of a known device of the above described type) without requiring complex manufacturing steps if remarkably downsized.

In an attempt to meet the demand, there have been proposed a DRAM where film of a material with a high dielectric constant such as $Ba_xSr_{1-x}TiO_3$ (0.1<x<0.9) is used for capacitor s in place of conventional silicon oxide film (dielectric constant=3.9) or silicon nitride film (dielectric constant=7.8) (IEDM, 95 Technical Digest, pp.115–117, "Novel Stacked Capacitor Technology for 1 Gbit DRAMs with CVD-(Ba, Sr) $TiO_3$ Thin Films on a Thick Storage Node of Ru") and a FeRAM (ferroelectric memory) making using of the hysteresis characteristics of a ferroelectric material as shown in FIG. 1.

However, a highly dielectric material will inevitably show a significant reduction in the dielectric constant if it is used to form thin film (with a thickness between 10 and 50 nm) so that a DRAM with a large memory capacity of 1 to 4 Gbits will have to be designed to show a three-dimensional configuration, making it difficult to reduce the number of manufacturing steps and the manufacturing cost. For example, a material that shows a dielectric constant exceeding 1,000 when it takes the form of a film with a thickness of 200 nm will lose its dielectric constant to a level of about 200 when it is made into a thin film with a thickness between 10 and 20 nm that can feasibly be used for memory devices of the 0.1 μm generation.

As for FeRAMs, on the other hand, ferroelectric substances such as $Pb(Zr, Ti)O_3$ and $SrBi_2Ta_2O_9$ that have been studied extensively show a remarkable reduction in the residual dielectric polarization when they are made into a thin film that can feasibly be used for integrated circuits so that the level of polarization satisfactory for memory devices of the 0.1 μm generation to operate to store enough data will not be obtained.

The use of monocrystalline (Ba, Sr)$TiO_3$ film has been proposed recently as a solution to the above identified problems (see Kazuhide ABE et al. Japanese Patent Application Laid-Open No. 08-139292). A film of monocrystalline (Ba, Sr) $TiO_3$ can be made to show properties both as a high dielectric film and a ferroelectric film by selecting appropriate values for the Ba and Sr contents. If it is made to have a composition good for a highly dielectric film (e.g., $B_{0.5}Sr_{0.5}TiO_3$), a thin film of the substance will show a very high dielectric constant when it has a thickness of 10 nm.

If, on the other hand, it is made to have a composition of $B_{0.3}Sr_{0.7}TiO_3$, the film shows properties as a highly ferroelectric substance. Unlike $Pb(Zr, Ti)O_3$ or (Ba, Sr) $TiO_3$ pointed out above, this substance does not lose its ferroelectricity if it is made into a thin film with a thickness of about 10 nm and hence seems promising for FeRAMs of the 0.1 μm generation. In short, it may be possible to prepare DRAMs and FeRAMs from this substance by appropriately modifying the Ba and Sr contents.

However, since the properties of the substance as a highly dielectric substance and as a ferroelectric substance become apparent only the substance takes the form of a monocrystalline thin film, a monocrystalline thin film of the substance has to be produced on an Si substrate by epitaxial growth if it is to be used for an integrated circuit. There have been proposed a technique of sequentially forming an electroconductive oxide film having a crystal structure same as that of BST and a BST film by epitaxial growth with a buffer layer arranged on the Si substrate in order to alleviate the difference in the lattice constant.

It should be noted, however, that capacitors cannot be produced with ease on a DRAM or FeRAM by epitaxially growing a film of the substance because there are transistors already formed on the DRAM or FeRAM. This is because an insulator film is normally stacked on the transistors, whereas epitaxial growth requires information of the bearing of the crystals of the Si substrate.

FIG. 2 of the accompanying drawing shows a schematic cross sectional view of a known semiconductor memory device having a COB (capacitor over bit line) structure.

Such a device is prepared by firstly forming an element isolating region 2 and a diffusion layer 5 in an Si substrate 1 and then a gate electrode 3 and a bit line 6 are formed sequentially on the substrate before a contact hole is cut through the interlevel dielectric layers 4 and 7 filled into the interlayer gaps. Then, a monocrystalline Si layer 8 is formed to fill the contact hole by means of an Si epitaxial growth technique and lower electrode layers 9 and 10 are formed thereon. The surface of the device is polished typically by CMP (chemical mechanical polishing). Finally, a capacitor insulator film 11 which is typically a (Ba, Sr) $TiO_3$ film and an upper electrode layer 12 are formed thereon.

Since the contact hole is normally designed according to a minimal design rule, it shows an opening not square but circular. It is extremely difficult to selectively deposit Si film by epitaxial growth in such a round and deep contact hole and, if deposited successfully, such an epitaxially grown crystalline film may safely be assumed to contain a number of flaws in it.

Meanwhile, when polishing the interlevel dielectric film 7 and the electrode layer 10 to realize a smooth surface by CMP, steps may be formed at the edges of the electrode layer 10 because it is difficult to polish them at a same rate. Such steps adversely affect the effort of obtaining a capacitor insulator film 11 with a uniform film thickness and the produced uneven insulator film 11 will gradually lose its reliability.

In other words, in order to realize a capacitor insulator film that is a monocrystalline film of a highly dielectric substance or a ferroelectric substance, there need to be an underlying electrode layer that is oriented in the direction of (100) and highly smooth. However, it is extremely difficult to form a storage node with epitaxial Si on a gate electrode and a bit line and then produce a (100)-oriented electrode layer thereon in a self-aligning manner. It is also difficult to produce a flat and smooth lower electrode structure.

Thus, while DRAMs and FeRAMs using monocrystalline BST film for the capacitor insulator film have been proposed as novel memory devices that can securely store a sufficient amount of data if micronized, the process of manufacturing such DRAMs or FeRAMs involves complex steps for producing fine capacitor structures.

Additionally, it is highly difficult to form a monocrystalline underlying electrode layer on a gate electrode and a bit line for a layer of a ferroelectric or highly dielectric substance such as (Ba, Sr) TiO$_3$ to be formed by epitaxial growth without degrading the performance of the capacitor dielectric film to be formed thereon.

BRIEF SUMMARY OF THE INVENTION

Therefore, an object of the present invention is to provide a semiconductor memory device comprising an underlying electrode adapted to operate as an insulator film for capacitors and made of a very flat ferroelectric film (or a high dielectric film) in order to effectively avoid degradation in the performance of the ferroelectric film (or high dielectric film) and also provide a method of manufacturing such a semiconductor memory device.

Another object of the invention is to provide a semiconductor memory device that allows an easy epitaxial growth for the transistors formed in it and also provide a method of manufacturing such a semiconductor memory device.

Still another object of the invention is to provide a semiconductor memory device that allows an easy epitaxial growth for the transistors formed in it by smoothing and exposing the surface of the monocrystalline Si substrate of the device and also provide a method of manufacturing such a semiconductor memory device.

According to a first aspect of the invention, the above objects are achieved by providing a semiconductor memory device comprising: a semiconductor section carrying a transistor formed therein; and a capacitor section having a capacitor; the capacitor including epitaxially grown first and second electrodes; and an epitaxially grown dielectric film arranged between the first and second electrodes.

In the semiconductor memory device according to the first aspect of the present invention, the transistor and the capacitor form a memory cell, the first electrode and the second electrode are sequentially stacked above the monocrystalline substrate to produce a multilayer structure, the transistor is formed on the capacitor with an insulation layer interposed therebetween, and either the source or the drain of the transistor is connected to the second electrode by way of a contact hole formed through the insulation layer.

Preferably, a semiconductor memory device according to the invention meets all or part of the following requirements.

(1) The monocrystalline substrate is made of (100)-oriented silicon.

(2-1) The first electrode (capacitor lower electrode), the dielectric film (capacitor insulator film) and the second electrode (capacitor upper electrode) are epitaxially grown on the (100)-oriented silicon substrate.

(2-2) Both the first electrode and the dielectric film are films having a same crystal structure.

(2-3) The first electrode is made of an electroconductive material having a crystal structure with a tetragonal system type (100)-plane and the dielectric film has a tetragonal system type perovskite crystal structure.

(2-4) The dielectric film is a single layer film containing Ba, Sr and Ti or a multilayer film containing Ba, Sr and Ti.

(2-5) The dielectric film is made of a material expressed by general formula Ba$_x$Sr$_{1-x}$TiO$_3$ ($0.1 \leq x \leq 0.9$) and having a perovskite structure.

(2-6) The first electrode is a multilayer film having at least two layers, one being made of a material adapted to prevent any mutual diffusion from taking place between the electrode underlayer and the dielectric film, the other being made of a material selected from the viewpoint of work function in order to improve the performance of the dielectric film.

(3-1) The first electrode is formed on the surface of the substrate as plate electrode, which is taken out on the surface of the element isolation film by the electroconductive film formed with and buried in the contact hole at an end of the memory cell array comprising two-dimensionally arranged memory cells.

(3-2) The first electrode extends beyond the end of the memory cell array.

(3-3) The dielectric film is etched out at the end of the memory cell array.

(4-1) The capacitor is made to store an electric charge that is increased by utilizing the relative dielectric constant of the dielectric film higher than that of the silicon oxide film.

(4-2) The first electrode is formed as common plate electrode adapted to provide a common electric potential to a plurality of memory cells and the second electrode is formed independently for each of the memory cells.

(4-3) The dielectric film shows a Curie temperature above the operation temperature range of the device and is paraelectric at room temperature.

(5-1) The dielectric film is ferroelectric at room temperature and data is written into the device by utilizing the fact that the interface resistance of the dielectric film and the electrode varies as a function of the direction of polarization of the dielectric film when the dielectric film is subjected to an electric field greater than the coercive electric field, whereas data is read out of the device without destructing the data by utilizing the change in the leak current that occurs when the dielectric film is subjected to an electric field less than the coercive electric field.

(5-2) The first electrode is formed as plate electrode adapted to operate as plate lines running on the substrate surface in parallel with bit lines and provide a common electric potential to a plurality of memory cells and the second electrode is formed independently for each of the memory cells.

(5-3) The dielectric film shows a Curie temperature above the operation temperature range of the device and is paraelectric at room temperature.

(6-1) The semiconductor layer is prepared by bonding a second silicon substrate on a monocrystalline substrate (first silicon substrate) with an insulator film interposed therebetween and made to show a desired height by polishing the second silicon substrate.

(6-2) The semiconductor layer (second silicon substrate) has a thickness not exceeding 300 nm and is adapted to keep the electric potential of the transistor substrate formed on the second silicon substrate to a desired level.

(6-3) The semiconductor layer (second silicon substrate) has a thickness not exceeding 100 nm and is adapted to make the electric potential of the transistor substrate formed on the second silicon substrate float.

(6-4) The semiconductor layer (second silicon substrate) has a thickness not exceeding 60 nm and the channel region of the transistor formed in the second silicon layer is completely depleted when the transistor is in operation.

According to a second aspect of the invention, there is provided a method of manufacturing a semiconductor memory device having a memory cell including a transistor and a capacitor, the method comprising steps of: forming a capacitor on a monocrystalline substrate sequentially and epitaxially growing a first electrode, a dielectric film and a second electrode; forming a semiconductor layer on the monocrystalline substrate carrying the capacitor thereon with an insulator film interposed therebetween; forming a MOS-type transistor on the semiconductor layer; forming a contact hole running through the semiconductor layer and the insulator film; and connecting either the source or the drain of the transistor to the second electrode by way of the contact hole.

Preferably, a method of manufacturing a semiconductor memory device according to the invention meets all or part of the following requirements.

(1) For forming the contact hole, an etching stopper material is formed on the surface of the second electrode to stop the etching operation of forming the contact hole and, after the etching operation conducted for forming the contact hole, the exposed etching stopper material is selectively removed to expose the second electrode to the surface.

(2) For forming the semiconductor layer, a second silicon substrate is clad on the monocrystalline substrate (first silicon substrate) with an insulator film interposed therebetween and then the second silicon substrate is polished to make it show a desired height.

(3) The first electrode is produced as a plate electrode in the form of plate lines running in parallel with a bit line on the surface of the silicon substrate that provides a common potential to a plurality of memory cells and the manufacturing method comprises a step of processing the first electrode into the form of a line running in parallel with a bit line simultaneously with the second electrode and a step of processing the second electrode to make it operate independently for each memory cell.

(4) The first electrode is produced as a plate electrode in the form of plate lines running in parallel with a bit line on the surface of the silicon substrate that provides a common potential to a plurality of memory cells and the manufacturing method comprises a step of processing the first electrode into the form of a line running in parallel with a bit line, etching the silicon substrate to produce a groove and burying an insulator film into the groove and a step of processing the second electrode to make it operate independently for each memory cell.

(5) The first electrode is produced as a plate electrode in the form of plate lines running in parallel with a bit line on the surface of the silicon substrate that provides a common potential to a plurality of memory cells and the manufacturing method comprises a step of processing the first electrode into the form of a line running in parallel with a bit line and burying an insulator film into the gaps of the plate lines and a step of processing the second electrode to make it operate independently for each memory cell.

According to a third aspect of the invention, there is provided a method of manufacturing a semiconductor memory device having a memory cell including a transistor and a capacitor, the method comprising steps of: partially forming a capacitor on the monocrystalline substrate by epitaxially growing a first electrode, a dielectric film and a second electrode; forming a MOS-type transistor adjacent to the capacitor on the substrate; and connecting either the source or the drain of the transistor to the first electrode.

Preferably, a method of manufacturing a semiconductor memory device according to the invention meets all or part of the following requirements.

(1) A (100)-oriented silicon substrate is used for the monocrystalline substrate, on which the first electrode and the dielectric film are made to epitaxially grow.

(2) The dielectric film is a single layer film containing Ba, Sr and Ti or a multilayer film containing Ba, Sr and Ti and, particularly, the dielectric film is made of a material expressed by general formula $Ba_xSr_{1-x}TiO_3$ ($0.3 \leq x \leq 0.9$) and having a perovskite structure.

(3) The dielectric film shows a Curie temperature above the operation temperature range of the device and is highly dielectric (or ferroelectric film) at room temperature.

(4) The capacitor is formed by masking the monocrystalline substrate except the capacitor forming region, doping the exposed area of the substrate with an impurity and sequentially laying a first electrode, a monocrystalline dielectric film and a second electrode on the exposed area of the substrate to produce a multilayer structure, whereas the transistor is formed on the surface of the substrate after removing the mask and exposing the surface.

According to the third aspect of the invention, since a ferroelectric film (or a high dielectric film) can be formed as a capacitor insulator film on a plane surface of the monocrystalline substrate so that the electrode underlying the capacitor can also be formed flat to effectively suppress any degradation in the performance of the ferroelectric film (or the high dielectric film) (such as an increase in the leak current and the fatigue of the film and variances in the polarizability).

Additionally, since the capacitor of a ferroelectric film (or a high dielectric film) is located below the transistor, the capacitor does not show any steps that can be produced in the wiring step to facilitate the steps of forming contacts and wires and reduce the number of steps. Likewise, since the capacitor of a ferroelectric film (or a high dielectric film) is located below the semiconductor layer (which may be an SOI layer) of the transistor, it is less affected by the subsequent steps (such as damages due to plasma and other causes) to reduce the damage of the capacitor due to the process and improve the manufacturing yield. Still additionally, the fact that the capacitor of a ferroelectric film (or a high dielectric film) is located below the transistor makes it possible to utilize an area under the transistor for the capacitor region to increase the total area of the capacitor so that consequently the device can increase its stored electric charge and the operation margin of the memory cell to improve the yield of manufacturing such devices.

Still additionally, a dielectric film having an epitaxial grown perovskite crystal structure and formed on a (100)-oriented Si substrate makes it possible to raise the ferroelectricity and the relative dielectric constant of the device induced by harnessing the underlying layers and hence dissolve the problem of a crystalline dielectric material that its relative dielectric constant is reduced particularly when it is used in a very thin form. Finally, the arrangement of forming a lower electrode film having the structure of epitaxial grown perovskite crystal on a (100)-oriented Si substrate provides an advantage of morphorogically improving the surface of the lower electrode (by reducing the undulations on the surface) to suppress the leak current that can appear when the capacitor dielectric film is produced.

In the semiconductor memory device according to the first aspect, the transistor section includes an element isolation region, an insulator film formed on the gate electrode of the transistor and an epitaxially grown monocrystalline Si section; the top surface of the monocrystalline Si section being substantially flush with those of the element isolation region and the insulator film; the capacitor section having a buffer layer epitaxially grown on the monocrystalline Si section, the first electrode, the dielectric film and the second electrode being sequentially stacked on the buffer layer.

According to a fourth aspect of the invention, there is provided a method of manufacturing a semiconductor memory device having a memory cell including a transistor and a capacitor, the method comprising steps of: forming a first thin film on a monocrystalline silicon substrate; forming a first groove by etching the first thin film and the monocrystalline silicon substrate; burying the first groove by stacking a first insulator film therein; polishing and smoothing the device until the top surface of the first thin film becomes exposed; forming a second groove in the silicon substrate; forming a second insulator film and an electroconductive film in the second groove; forming a third insulator film on the electroconductive film; forming a diffusion layer by introducing an impurity into the surface of the silicon substrate; smoothing the device until the top surface of the first insulator film and those of the third insulator film and the silicon substrate are made substantially flush with each other; sequentially and epitaxially growing an electroconductive buffer layer, an electroconductive first metal electrode, a dielectric film and an electroconductive second metal electrode on the diffusion layer; and etching the buffer layer, the first and second electrodes and the dielectric film.

According to a fifth aspect of the invention, there is provided a method of manufacturing a semiconductor memory device having a memory cell including a transistor and a capacitor, the method comprising steps of: forming a first thin film on a monocrystalline silicon substrate; forming a first groove by etching the first thin film and the monocrystalline silicon substrate; stacking a first insulator film on the monocrystalline silicon substrate to bury the first groove; polishing the first insulator film until the top surface of the first thin film becomes exposed; removing the first thin film; etching the electroconductive thin film; forming a diffusion layer by introducing an impurity into the surface of the silicon substrate; epitaxially growing silicon on the diffusion layer; smoothing the device until the top surface of the epitaxially grown silicon is made flush with the top surface of the second insulator film; sequentially and epitaxially growing an electroconductive buffer layer, an electroconductive first metal electrode, a dielectric film and an electroconductive second metal electrode on the diffusion layer; and etching the buffer layer, the first and second electrodes and the dielectric film.

Preferably, a method of manufacturing a semiconductor memory device according to the invention meets all or part of the following requirements.

(1) The buffer layer, the first electrode and the dielectric film are epitaxially grown on a diffusion layer formed on an Si substrate.

(2-1) Both the first electrode and the dielectric film are films having a same crystal structure.

(2-2) Both the first electrode and the dielectric film are made of an oxide having a perovskite crystal structure.

(2-3) The first electrode is made of an oxide of Sr and Ru.

(2-4) The dielectric film is made of $Ba_xSr_{1-x}TiO_3$, provided that the requirement of $0.1<x<0.9$ is met.

(3-1) The second electrode is formed for each cell on the surface of the substrate as a storage node electrode.

(3-2) The dielectric film is etched out at the end of the memory cell array.

(3-3) The second electrode is formed as a common electrode for providing a common potential to a plurality of memory cells.

(4-1) The dielectric film shows a Curie temperature above the operation temperature range of the device and is paraelectric at room temperature.

(4-2) The dielectric film is ferroelectric at room temperature and data is written into the device by utilizing the fact that the interface resistance of the dielectric film and the electrode varies as a function of the direction of polarization of the dielectric film when the dielectric film is subjected to an electric field greater than the coercive electric field, whereas data is read out of the device without destructing the data by utilizing the change in the leak current that occurs when the dielectric film is subjected to an electric field less than the coercive electric field.

(4-3) The first electrode is formed independently for each of the memory cells and the second electrode is formed as common plate electrode adapted to provide a common electric potential to a plurality of memory cells and realized as plate lines running in parallel with a bit line.

(5-1) An element isolation (so-called shallow trench isolation, STI) region is formed inside the Si substrate and an insulator film is buried into it.

(5-2) The surface layer of the Si substrate is doped with an impurity to produce an diffusion layer having an n-type or p-type conductivity except the gate electrode and the element isolation region.

(5-3) The top surfaces of the element isolation region, the insulator film on the gate electrode and the diffusion layer are made flush with each other.

(6-1) A buffer layer, a first electrode and a high dielectric film (or a ferroelectric film) are formed on the surface of the diffusion layer by epitaxial growth.

(6-2) The second electrode is made of an electroconductive oxide.

According to the invention, while the capacitor is formed by epitaxial growth after forming the transistor, the epitaxial growth can be realized in an ideal form because the surfaces of the Si substrate, the gate electrode and the element isolation region are made flush with each other.

Additionally, since the capacitor insulator film and the electrodes are made of monocrystalline film that is epitaxially grown on the basis of the bearing of the Si monocrystal structure of the substrate, high dielectricity or ferroelectricity can be realized by selecting an appropriate composition.

Still additionally, a dielectric film having an epitaxial grown perovskite crystal structure and formed on a monocrystalline Si substrate makes it possible to raise the ferroelectricity and the relative dielectric constant of the device induced by harnessing the underlying layers and hence dissolve the problem of a crystalline dielectric material that its relative dielectric constant is reduced particularly when it is used in a very thin form.

Furthermore, the arrangement of forming an epitaxially grown electrode film and epitaxially growing an electroconductive oxide having a perovskite type crystal structure on the dielectric film can make the electrodes/dielectric film very smooth and minimize any lattice mismatching to effectively suppress the leak current and improve the reliability of the device.

Finally, since a diffusion layer is formed inside the Si substrate in advance by diffusion a dopant and then a buffer layer, a lower electrode, a dielectric film and an upper electrode are sequentially formed thereon by epitaxial growth, the transistor and the capacitor can be connected automatically to eliminate the steps of forming a contact hole and burying an electroconductive material into the hole and hence simplify the overall manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A through 11D are schematic cross sectional views of a six embodiment of semiconductor memory device according to the invention, showing the device in different manufacturing steps;

DETAILED DESCRIPTION OF THE INVENTION

Now, the present invention will be described by referring to the accompanying drawing that illustrates preferred embodiments of the invention.

FIGS. 3 through 6D schematically illustrate a first embodiment of semiconductor memory device according to the invention.

Figure 3:
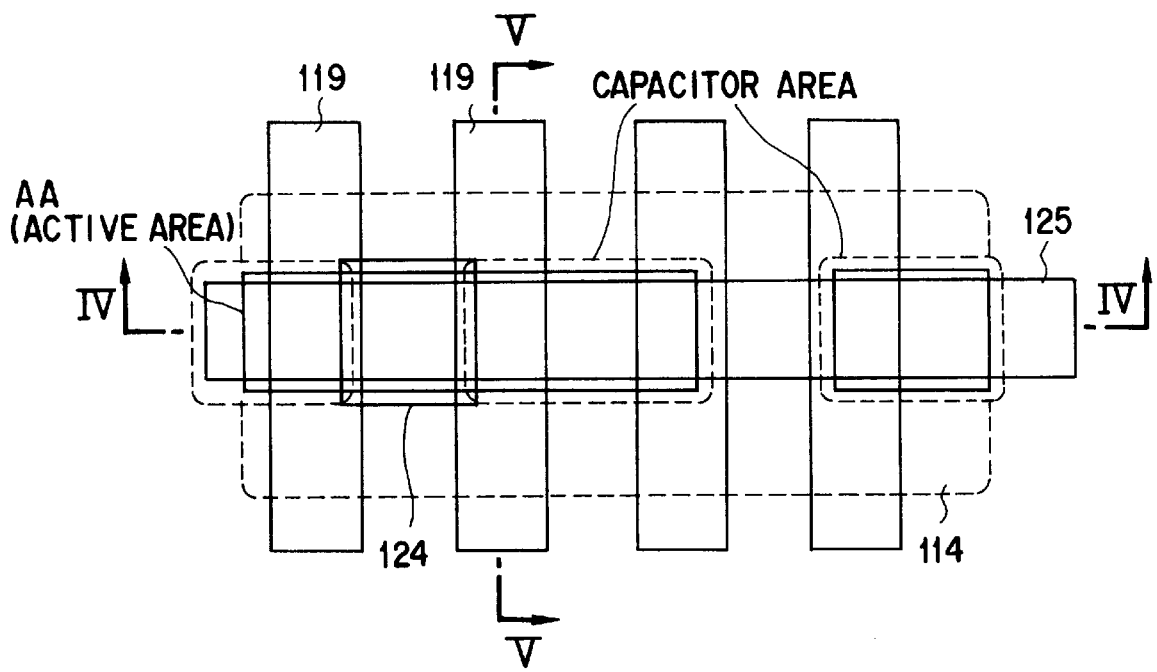
FIG. 3 is a schematic plan view of a first embodiment of semiconductor memory device according to the invention.
Figure 4:
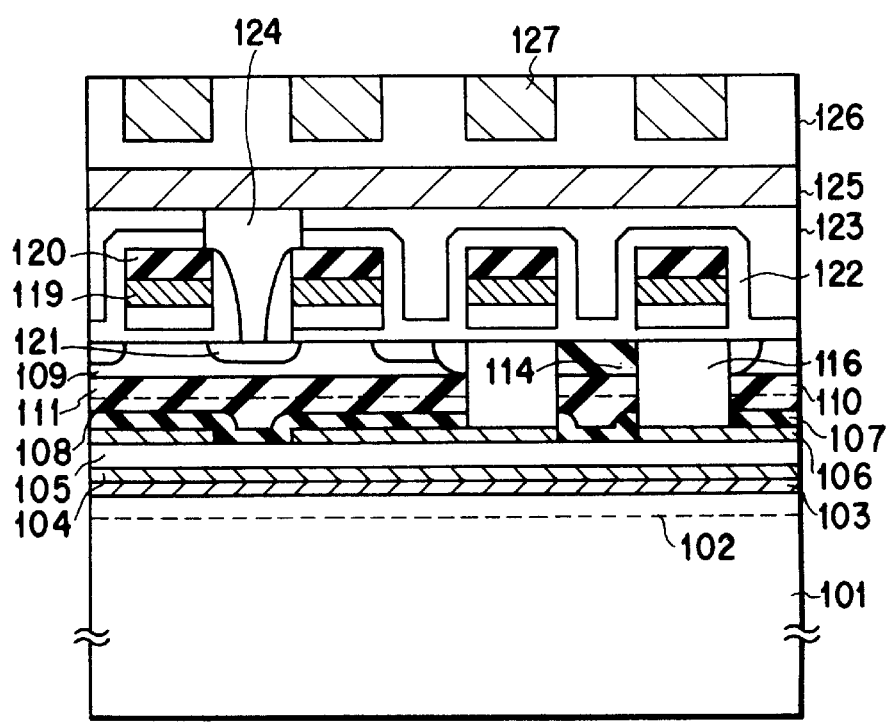
FIG. 4 is a schematic cross sectional view of the embodiment of FIG. 3 taken along line IV—IV.
Figure 5:
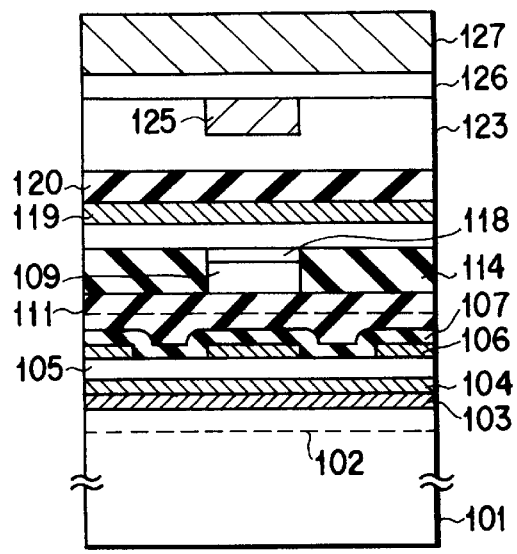
FIG. 5 is a schematic cross sectional view of the embodiment of FIG. 3 taken along line V—V.

FIG. 3 is a schematic plan view of a first embodiment of semiconductor memory device according to the invention which is a DRAM, illustrating the device only for a bit and adjacent areas. FIGS. 4 and 5 are schematic cross sectional views of the device taken respectively along arrows IV—IV and V—V in FIG. 3.

An $n^+$ type diffusion layer 102 is formed as a subcapacitor electrode on the surface of a (100)-oriented p-type silicon substrate (first substrate) 101 having an impurity concentration between 1 and $5 \times 10^{15}$ cm$^{-3}$ and an underlying barrier electrode layer 103 of epitaxially grown TiAlN, a lower electrode (first electrode) 104 of epitaxially grown SrRuO$_3$, a capacitor insulator film (dielectric film) 105 of epitaxially grown (Ba, Sr) TiO$_3$ and an upper electrode (second electrode) 106 of epitaxially grown SrRuO$_3$ are sequentially formed thereon to realize a thin film capacitor.

Then, an SOI (silicon on insulator) layer (semiconductor layer) 109 that operates as a second substrate is arranged on the substrate 101 that carries a capacitor thereon with insulator films 108 and 110 interposed therebetween. Thereafter, a gate electrode (word line) 119 is formed on the SOI layer 109 and then a source/drain diffusion layer 121 is formed in the SOI layer 109 to produce a MOS (metal oxide semiconductor) transistor. Then, either the source or the drain of the source/drain diffusion layer 121 and the upper electrode 106 of the capacitor are electrically connected to polysilicon layer 116 in the contact hole of the cell to produce a complete memory cell.

Referring to FIGS. 4 and 5, there are also shown a stopper Si$_3$N$_4$ film 107, a clad interface 111, an STI element isolating region 114, a gate insulator film 118, a cap layer 120, another stopper $Si_3N_4$ film 122, interlevel dielectric layers 123 and 126, a bit line contact 124, a bit line 125 and a wiring layer 127.

Now, a method of manufacturing a DRAM of the first embodiment will be described by referring to FIGS. 6A through 6C. The cross sectional views of FIGS. 6A through 6C are also taken along line IV—IV in FIG. 3 in different manufacturing steps.

Figure 6A:
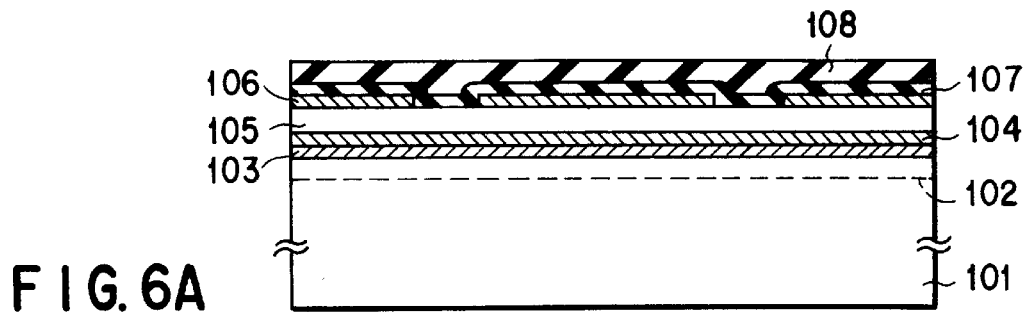
FIGS. 6A through 6D are schematic cross sectional views of the embodiment of FIG. 3, showing the device in different manufacturing steps.
Figure 6B:
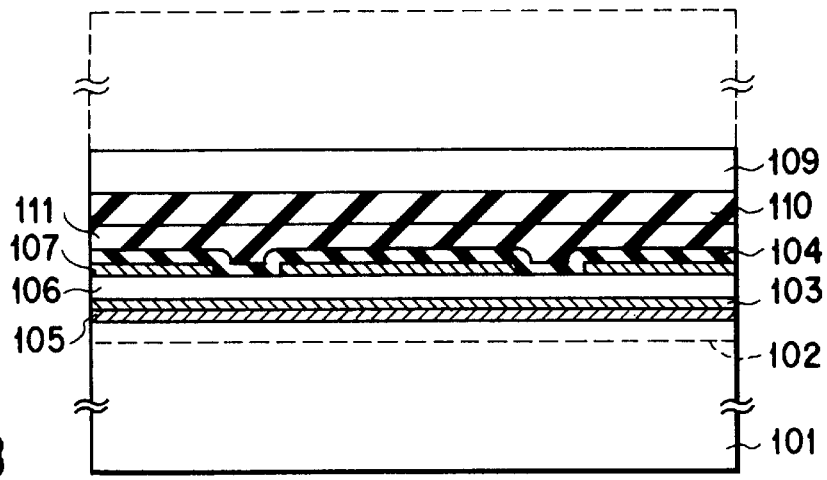
Figure 6C:
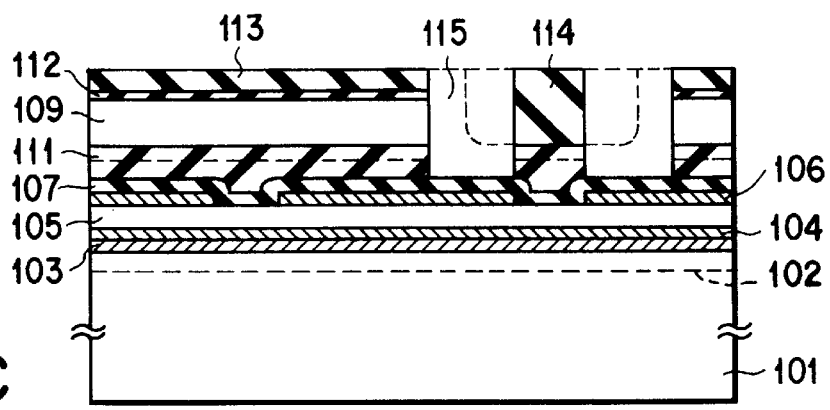

Referring firstly to FIG. 6A, the first substrate 101 is a p-type Si substrate (or a so-called epitaxial substrate prepared by growing a p-type epitaxial Si layer to a thickness of about 1 μm on the surface of a p-type Si substrate) oriented in the direction of (100) plane and having an impurity concentration between 1 and $5 \times 10^{15}$ cm$^{-3}$.

Then, a lower electrode group is formed to operate as a plate electrode (PL) that shows a common constant potential in the DRAM mode and as individual plate lines running in parallel with word lines for respective memory cells in the FeRAM mode. Note that the plate electrode is shown in FIG. 6B that will be described hereinafter. The individual plate lines of the memory cells are also referred to as drive lines and will be described hereinafter by referring to the second through fourth embodiments of the invention.

More specifically, an n$^+$ type diffusion layer 102 is formed to a depth of about 0.05 μm in the Si substrate 101 and then a titanium aluminum nitride TiAlN film and an $SrRuO_3$ film are sequentially formed thereon to respective thicknesses of 10 nm and 20 nm as lower barrier electrode layer 103 and lower electrode 104.

The n$^+$ type diffusion layer 102 may be formed by using a resist mask (not shown) and an As$^+$ ion implantation technique. For producing the lower barrier electrode layer 103 and the lower electrode 104, the substrate is heated to about 600° C. and then a TiAlN film and an $SrRuO_3$ film are formed by sequential sputtering and made to grow sequentially by epitaxial growth. If necessary, the film layers may be annealed at about 700° C. so that they may be epitaxially grown to show appropriately oriented crystal grains.

The lower barrier electrode layer 103 is a metal film or an electroconductive oxide film adapted to operate effectively as barrier that prevents any mutual diffusion from occurring between the Si substrate 101 and the capacitor insulator film that will be formed in a subsequent step. Metals that operate as barrier and hence can be used for the purpose of the invention include nickel silicate and cobalt silicate that show a lattice-matching with silicon as well as titanium nitride and tungsten nitride. It is highly important for the lower electrode 104 to be made of a material that minimizes the leak current of the dielectric film to be formed when the memory device operates in the DRAM mode. While TiAlN and $SrRuO_3$ are used for the barrier layer and the lower electrode respectively in this embodiment, it is important to be careful about the selection of the materials of the barrier layer and the lower electrode, their respective film thicknesses and the film forming conditions in order to prevent the (100) orientation of the dielectric film to be formed from being damaged.

Thereafter, a dielectric (Ba, Sr) $TiO_3$ film is formed on the entire surface for the capacitor insulator film 105 typically by RF magnetron sputtering, heating the substrate to about 600° C. in an atmosphere of a gaseous mixture of Ar and $O_2$. A double target system of sintered $BaTiO_3$ and sintered $SrTiO_3$ may be used for the target of the sputtering operation.

The dielectric film is made to show a film thickness of about 30 nm. The content ratio of the ingredients, or Ba, Sr and Ti, of the dielectric film can be regulated by using an appropriate analytic method such as ICP emission spectrometry. It is also important to ensure that the produced dielectric film is oriented in the direction of the (100) plane typically by means of X-ray diffractometry. Note that MOCVD (metal organic chemical vapor deposition) technique may be used in place of magnetron sputtering to produce a dielectric film for the purpose of the invention.

Thereafter, the upper electrode 106 is stacked over the entire surface of the dielectric film 105 by heating the substrate to about 60° C. and typically forming an $SrRuO_3$ film to a thickness of about 50 nm by sputtering, which $SrRuO_3$ is then made to epitaxially grow on the dielectric film 105. If necessary, the stacked film may be annealed at about 700° C. to improve the conditions of the interface and promote the epitaxial growth of the upper electrode. Also if necessary, a TiN/Ti film (about 15 nm/15 nm thick) (not shown) may be formed on the upper electrode to make it operate as barrier for the upper electrode when contact holes are cut through the upper electrode.

Then, the upper electrode 106 is processed by ordinary photolithography and plasma etching (e.g., RIE (reactive ion etching)). Note that the upper electrode 106 corresponds to the storage node of a DRAM. Then, a silicon nitride film ($Si_3N_4$) 107 is stacked on the entire surface of the upper electrode as stopper film to a thickness of about 40 nm. The stopper film 107 operates as etching stopper layer in the process of cutting contact holes that prevents the dielectric film 105 and the electrode films 103, 104 and 106 from degradation (due to compositional changes and mutual diffusion) that can occur during the annealing to be conducted typically in a hydrogen atmosphere.

Alternatively, though not illustrated, the upper electrode may be processed by using a patterned mask of $Si_3N_4$ film and another $Si_3N_4$ film may be stacked thereon until the recessed areas formed in the upper electrode 106 are filled with $Si_3N_4$ so that a flat $Si_3N_4$ stopper layer may be formed by CMP (chemical mechanical polishing). This arrangement can significantly facilitates the subsequent process of cutting contact holes.

Then, an insulator film 108 of BPSG (boron-phosphosilicate grass) is stacked on the entire surface of the stopper layer to a thickness of about 500 nm and made flat typically by means of CMP. This flat insulator film 108 takes an important role in forming an SOI layer in a subsequent manufacturing step and has to be made flat to an extent required for cladding the Si substrate in the wafer surface area.

Then, as shown in FIG. 6B, an about 10 nm thick thermally oxidized film ($SiO_2$) and an about 200 nm thick BPSG (or CVD-$SiO_2$) film (not shown) are sequentially formed as a clad insulator film 110 on the surface of the second Si substrate 109. Then, the insulator film 110 on the second substrate and the flat insulator film 108 on the first substrate are put together and bonded to each other along clad interface 111. This cladding can be realized by means of any known technique. For example, the insulator films may be made of a substance that can be treated for the cladding at about 900° C. or a substance such as BPSG that is adhesive at low temperature. The use of BPSG film is advantageous because it can stop the etching for forming contact holes in a subsequent manufacturing step at the $Si_3N_4$ film layer 107 (as will be described in greater detail hereinafter).

Thereafter, the second Si substrate is polished from the back side (or the flat upside in FIG. 6B) to produce an SOI layer 109 having a thickness of about 150 nm. Note that some other SOI layer forming process involving cladding/polishing may alternatively be used for the purpose of the invention. Also note that the surface of the SOI layer 109 has to be mirror-polished in order to make itself adapted to forming transistors thereon in a subsequent manufacturing step.

Now, the thickness of the SOI layer 109 will be discussed briefly for several alternatives. When the SOI layer has a thickness between 150 nm and 300 nm, the clad insulator film 110 under the SOI layer would not be affected by STI element isolation. In other words, the $p^-$ or $n^-$well (the transistor substrate) of the SOI layer is isolated by the element isolation layer. Thus, an SOI layer provides the advantage of suppressing the leak of stored electric charge due to a floating substrate that can appear in known DRAMs.

When, the SOI layer has a thickness between 60 nm and 150 nm, the substrate of each of the SOI transistors are perfectly isolated from each other by STI element isolation for about 0.15 $\mu$m. Although the transistor substrate of the SOI layer may become floating, the channel region can be made to show a state of PD (partial depletion) by controlling the ion implantation. In contrast to known SOI structures that are accompanied by a problem that the threshold cannot be selected freely, the above described SOI structure is free from the problem and an appropriately selected threshold value can be used without difficulty. The SOI layer 109 may have an appropriate thickness depending on the application.

Finally, when the SOI layer has a thickness less than 60 nm, the channel of each of the SOI transistors are completely depleted to show a state of full depletion. Such an SOI layer is advantageous in that the channel curtailing effect of the transistor can be suppressed. Thus, the SOI layer 109 may have an appropriate thickness in any of the above discussed ranges depending on the application.

Thereafter, referring to FIG. 6C, a trench type element isolation layer 114 (STI (shallow trench isolation) with a trench depth of about 0.15 $\mu$m) is formed by producing a groove in the SOI layer 109 typically by reactive ion etching (RIE) and filling the groove with insulator film of $SiO_2$. For this process, a 5 nm thick $SiO_2$ film 112 and a 100 nm thick $Si_3N_4$ film 113 are formed in advance on the surface of the SOI layer 109 in order to protect the surface of the SOI layer 109. The surface of the buried insulator film of the STI is made flush with that of the $Si_3N_4$ film 113.

Subsequently, a contact hole 115 is formed by means of ordinary photolithography and plasma etching such as RIE. In the RIE operation, the $Si_3N_4$ film 113 and the $SiO_2$ film 112 on the surface of the SOI layer 109, the SOI layer 109 itself and the $SiO_2$ layer 114 of the STI will be treated under same etching conditions and then the oxide type films of the cladding oxide film 110 and the smoothing insulator film 108 will be etched by modifying the etching conditions so that the etching may be selectively stopped by the stopper $Si_3N_4$ film 107. The etching conditions are preferably so selected that the rate at which the oxide films including the BPSG film is are etched is by far (about 15 times) greater than the etching rate for the $Si_3N_4$ film.

Figure 6D:
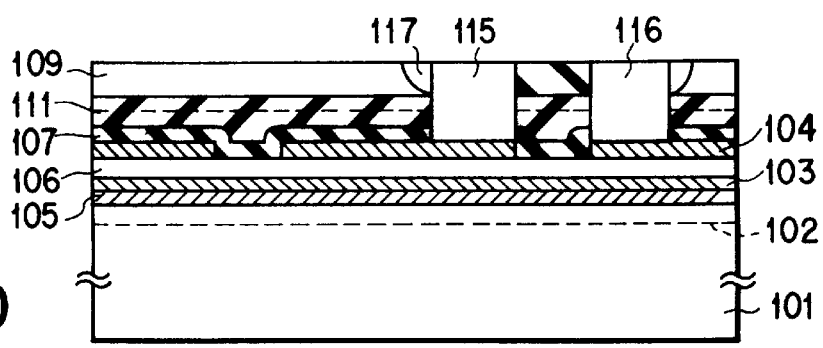

Then, referring to FIG. 6D, the stopper $Si_3N_4$ film 107 on the bottom of the contact hole 115 is selectively removed to expose the surface of the upper electrode 6. Note that the $Si_3N_4$ film 113 on the surface of the SOI layer is also removed at this time. Thereafter, a film layer of polysilicon containing an $n^+$ type impurity is stacked on the entire surface to a thickness of about 200 nm and then totally etched back typically by means of CMP to produce a buried layer of $n^+$ type polysilicon in the contact hole 115. Subsequently, the device is annealed by means of an RTA (rapid thermal anneal) technique at 800° C. for about 20 seconds in a nitrogen atmosphere to produce an $n^+$ type side wall diffusion layer 117 on the lateral sides of the buried layer 116 and the SOI layer 109.

Then, a process of channel ion implantation is conducted in a desired manner by way of the $SiO_2$ film 112 on the surface of the SOI layer by means of an ordinary photolithography technique in order to selectively produce channel impurity layers (not shown) for n-channel and p-channel transistors. For n-channel transistors, for instance, boron ions ($B^+$) may well be implanted to a dose rate of about $5 \times 10^{12}$ $cm^{-2}$ by applying an acceleration voltage of 10 Kev in order to produce a p-type channel impurity layer (not shown) selectively only in the n-type channel region. Alternatively, this ion implantation process may be conducted after removing the $SiO_2$ film 12 and forming another $SiO_2$ film once again.

Thereafter, as shown in FIGS. 4 and 5, the $SiO_2$ film 112 is removed from the surface of the SOI layer to expose the SOI substrate 109 and then a gate insulator film ($SiO_2$ film) 116 is formed to a film thickness of about 6 nm. Subsequently, an $n^+$ type polysilicon layer (having a film thickness of about 50 nm) to be used for the gate electrode ($SiO_2$ film) 119, a tungsten silicide film (having a film thickness of about 50 nm) and a cap $Si_3N_4$ film 120 are stacked sequentially.

Subsequently, the cap $Si_3N_4$ film 120 is processed typically by means of photolithography and RIE and then the tungsten silicide film and the $n^+$ polysiilicon film are subjected to a patterning operation for the gate electrode, using the processed cap $Si_3N_4$ film 120 as mask.

While a combined layers of a tungsten silicide film and a $n^+$ polysilicon film are used for the gate electrode 119 in this first embodiment, the gate electrode may alternatively be formed from a single polysilicon layer or have some other multilayer structure such as a combination of a tungsten film and a $n^+$ polysilicon film. The cap $Si_3N_4$ film 120 is to be used as a self aligning contact in subsequent steps. Then, an $n^-$ type diffusion layer 121 is formed in a desired region by implanting phosphor ($P^+$) ions at a dose rate of about $4 \times 10^{13}$ $cm^{-2}$, applying an acceleration voltage of 70 Kev and using the gate electrode 119 as mask. Similarly, a $p^-$ type source/drain diffusion layer (not shown) is formed.

Thereafter, an $Si_3N_4$ film is stacked on the entire surface of the device and subsequently it is subjected to an RIE process for a desired region, using a resist mask in order to keep the $Si_3N_4$ film remaining on the lateral wall of the gate electrode 119 (remained side wall) so that an $Si_3N_4$ film (not shown, existing only in a peripheral circuit area) may be formed on the peripheral wall of the gate electrode 119 to a film thickness of about 30 nm. Subsequently, an $n^+$ type diffusion layer (not shown) is formed in a desired region by implanting arsenic ($B^+$) ions at a dose rate of about $5 \times 10^{15}$ $cm^{-2}$, applying an acceleration voltage of 30 Kev, in order to produce an LDD structure. Similarly, a $p^+$ type diffusion layer (not shown) is formed.

It should be noted that, while an LDD structure is used in this embodiment, a single source/drain structure comprising only an $n^-$ type diffusion layer or an $n^+$ type diffusion layer may alternatively be used for the purpose of the invention. Additionally, while the source/drain formation for an n-channel is described above, a $p^-,p^+$ type source/drain diffusion layer will be formed when the peripheral circuit is realized as CMOS for a p-channel.

Then, a CVD-Si$_3$N$_4$ film is stacked on the entire surface of the device to a thickness of about 30 nm as a stopper Si$_3$N$_4$ film 122 and then a BPSG film 123 is stacked to a thickness of about 500 nm as an interlevel dielectric film. Thereafter, the film layers are subjected to a process of densification at about 800° C. in an N$_2$ atmosphere. This thermal process may well be conducted also to activate the ion-implanted source/drain layer. If the depth (X$_j$) of the diffusion layer is to be limited, the densification temperature may be reduced to about 750° C. and the ion-implanted layer may be activated by additionally using an RTA (rapid thermal anneal) process that will be conducted at 950° C. for about 10 seconds.

Then, the entire surface of the device will be smoothed by means of a CMP technique. Thereafter, an n$^+$ polysilicon film 124 is formed and buried in the bit line contact region and then contacts (not shown) are formed on the source, the drain and the gate electrode before the bit line 125, the interlevel dielectric film 126 and the metal wiring layer 127 are sequentially formed. Then, a passivation film 113 (not shown) is stacked on the entire surface of the device to produce the basic structure of a DRAM.

With the configuration of a device and the process of manufacturing such a device as described above, a high dielectric film or a ferroelectric film to be used for the lower electrodes 103, 104 and the capacitor insulator film 105 can be formed on a plane surface of an Si substrate to suppress degradation in the performance of the high dielectric or ferroelectric film (in terms of increase in the leak current, the fatigue of the film, the dispersion of the dielectric constant and the polarizability and so on). Additionally, since a (100)-oriented Si substrate 101 can be used as an underlying layer, titanium nitride or SrRuO$_3$ that shows a substantial lattice-matching with silicon can stably be formed on the Si substrate 101 for the lower barrier electrode layer 103 and the lower electrode 104 in such a way that the (100)-orientation of the dielectric layer to be formed in a latter manufacturing step may not be damaged.

Thus, a titanium nitride film that can be epitaxially grown is formed on the Si substrate 101 for the lower barrier electrode layer 103. While their lattice constants show a ratio of 4:3 and hence, strictly speaking, do not exactly match each other, they can be considered to show a lattice-matching in a broader sense of the word because lattice-matching is viewed here in terms of a multiple of the lattice constants. An SrRuO$_3$ film that shows a lattice-matching with the lower barrier electrode layer 103 is formed on the barrier electrode layer 103 for the lower electrode 104. With this arrangement, the epitaxial property of the capacitor insulator film 105 to be formed on the lower electrode 104 will be held stable without damage.

Additionally, since a capacitor is located under the transistor, the capacitor would not show any undulations when wires are arranged so that the process of forming contacts and wires can be conducted without difficulty. Hence the entire process including smoothing steps can be significantly simplified. Still additionally, since the capacitor of a high dielectric film or a ferroelectric film is formed below the SOI layer 109 and covered by a Si$_3$N$_4$ film, it will not be subjected to adverse effects in the subsequent steps (such as plasma damages that may appear when contacts and wires are formed for the device and/or the reducing effect that may take place in an annealing process using hydrogen) so that any possible process damages that can occur to the capacitor insulator film 105 can be reduced to improve the manufacturing yield.

Furthermore, since the capacitor is arranged in a region below the transistor, the area located under the transistor can also be used for the capacitor to increase the capacitor region in the memory cell without increasing the total area of the memory cell. As a result, the stored charge can be raised to improve the operating margin of the memory cell and the yield of manufacturing semiconductor memory devices of the type under consideration.

Finally, since a (100)-oriented lower electrode and a (100)-oriented dielectric film typically having an epitaxially grown perovskite structure are formed on a (100)-oriented Si substrate in the above arrangement, the ferroelectricity induced by a confined electrode and the relative dielectric constant can be improved to dissolve the problem of a reduced relative dielectric constant that appears in a thin film of a crystalline dielectric material and by turn improve the storage capacitance of the capacitor.

Now, a second embodiment of semiconductor memory device according to the invention will be described by referring to FIG. 7.

Figure 7:
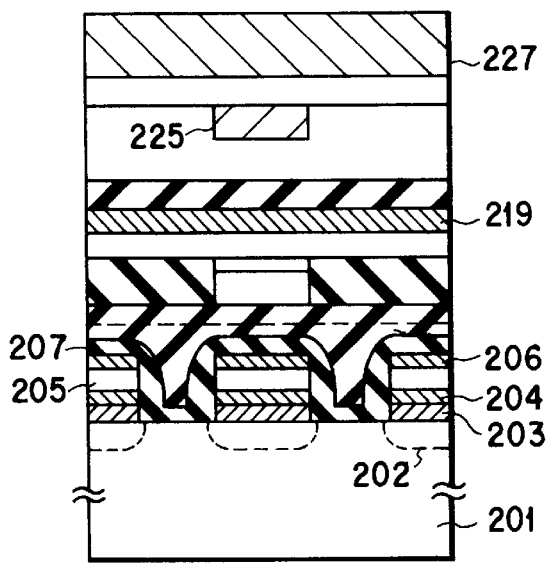
FIG. 7 is a schematic cross sectional view of a second embodiment of semiconductor memory device according to the invention.

FIG. 7 is a schematic cross sectional view of the second embodiment of semiconductor memory device according to the invention, showing the configuration of the device. Note that the view corresponds to the cross sectional view of the first embodiment taken along arrow line V—V in FIG. 3. Also note that reference symbols 201 through 227 in FIG. 7 respectively denotes the components same as those of FIGS. 4 and 5 denoted by reference symbols 101 through 127.

While the plate electrode (PL) that is formed to show a common constant potential in the DRAM mode is described above by referring to the first embodiment, the operation of the second embodiment in the FeRAM mode will be described here. In other words, independent lines are formed in this embodiment for individual plate lines (which are also called drive lines) that are used for the respective memory cells and arranged in parallel with the word lines.

Firstly an n$^+$ type diffusion layer 202 is formed in the form of lines arranged in parallel with the bit lines and having a depth of about 0.05 μm into an Si substrate 201 by photolithography and ion implantation. Then, a TiAlN film and an SrRuO$_3$ film are formed to thicknesses of about 10 nm and about 20 nm for the lower barrier electrode 203 and the lower electrode 204 respectively.

The n$^+$ diffusion layer 202 may be formed by means of a resist mask (not shown) and As$^+$ ion implantation technique, which are used by way of an oxide film (not shown). For producing the lower barrier electrode 203 and the lower electrode 204, the substrate is heated to about 600° C. and a TiAlN film and an SrRuO$_3$ film are formed sequentially thereon by sputtering and made to grow epitaxially. If necessary, the formed films may be annealed at about 700° C. for epitaxial growth.

The lower barrier electrode 203 is arranged in order to prevent any mutual diffusion from occurring between the Si substrate and the capacitor dielectric film 205. The work function of the lower electrode 204 can be regulated by using an appropriately selected material for it to change the size of the Schottky barrier at the interface with the dielectric film 205 and suppress the leak current of the capacitor dielectric film.

The morphology of the surface of the lower electrode is important for suppressing the leak current. The SrRuO$_3$ film formed on the Si substrate is an oriented epitaxial film and shows an excellent surface morphology that is good for effectively reducing the leak current. To select a material that can reduce the leak current is a requirement to be met for using the device in the DRAM mode, whereas the fatigue of the dielectric film provides a problem in the FeRAM mode because inverted polarization is utilized for writing data in the device.

Any misalignment of the dielectric film and the electrode at the interface and the stress applied to the dielectric film should be minimized because they can increase the fatigue of the dielectric film. From this point of view, the electrode is preferably made of a perovskite type electroconductive oxide such as $SrRuO_3$ because such a material can realize an enhanced degree of lattice matching. The interface alignment can be improved by epitaxially growing a dielectric material having a perovskite type crystal structure such as (Ba, Sr) $TiO_3$ film on an electrode made of a material also having a perovskite type crystal structure such as $SrRuO_3$.

The lower barrier electrode 203 and the lower electrode 204 may be made of a same and identical material if the use of such a material satisfies the above requirements. Anyway, what is important here is to appropriately select materials and film thicknesses for the lower barrier electrode and the lower electrode that do not damage the (100)-orientation of the capacitor dielectric film to be formed in the next step. It should be noted that this is one of the principal objectives of the present invention as described above by referring to the first embodiment.

Then, as in the case of the first embodiment, a dielectric film of (Ba, Sr) $TiO_3$ is formed on the entire surface as the capacitor insulator film 205 and an upper electrode 206 is formed thereon.

Thereafter, the upper electrode 206, the dielectric film 205, the lower electrode 204 and the lower barrier electrode 203 will be processed typically by ordinary photolithography and plasma etching (e.g., RIE). Note that the components 204, 203 and 202 arranged for the lower electrode corresponds to the plate lines (drive lines) in the FeRAM mode.

Then, a silicon nitride film ($Si_3N_4$) 207 is deposited on the entire surface of the upper electrode as stopper film to a thickness of about 40 nm and smoothed typically by means of a CMP technique. The subsequent steps are identical with the corresponding steps described above by referring to the first embodiment.

With the above described arrangement and manufacturing method, plate lines are produced to run in parallel with word lines and operate for the FeRAM mode of operation. Otherwise, the second embodiment is identical with the first embodiment.

Now, a third embodiment of semiconductor memory device according to the invention will be described by referring to FIG. 8.

Figure 8:
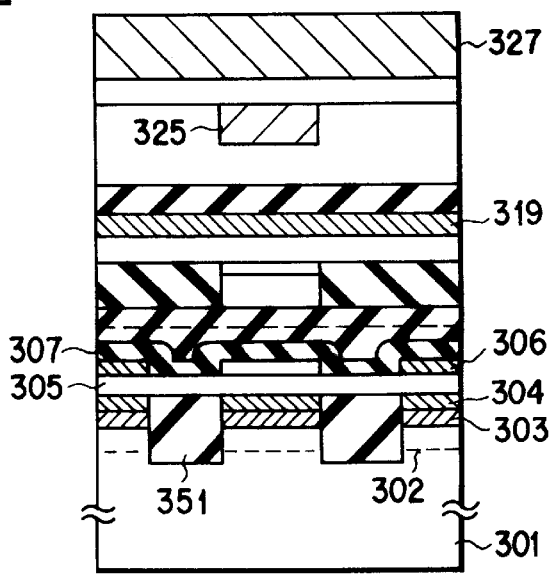
FIG. 8 is a schematic cross sectional view of a third embodiment of semiconductor memory device according to the invention.

FIG. 8 is a schematic cross sectional view of the third embodiment of semiconductor memory device according to the invention, showing the configuration of the device. Note that the view corresponds to the cross sectional view of the first embodiment taken along arrow line V—V in FIG. 3. Also note that reference symbols 301 through 327 in FIG. 8 respectively denotes the components same as those of FIGS. 4 and 5 denoted by reference symbols 101 through 127.

While the second embodiment is described above mainly in terms of the FeRAM mode of operation, the structural and operational features of the plate lines (drive lines) and a method of manufacturing such lines will be stressed in the following description for the third embodiment.

Firstly an $n^+$ type diffusion layer 302 is formed into a desired region of an Si substrate 301 to a depth of about 0.05 $\mu$m by photolithography and ion implantation. Then, a TiAlN film and an $SrRuO_3$ film are formed to thicknesses of about 10 nm and about 20 nm for the lower barrier electrode 303 and the lower electrode 304 respectively.

The $n^+$ type diffusion layer 302 may be formed as in the above described second embodiment. The lower barrier electrode 303 and the lower electrode 304 may also be formed as in the above described second embodiment. They my may be made of a same material and to a same film thickness.

Then, an $Si_3N_4/SiO_2$ films (not shown) are stacked to respective thicknesses of about 50 nm/10 nm as pad film layer on the entire surface typically by CVD. Thereafter, the lower electrode 304, the lower barrier electrode 303 and the Si substrate 301 are etched to produce plate lines running in parallel with word lines and grooves cut into the Si substrate 301 to a thickness of about 0.15 $\mu$m.

Thereafter, an oxide film (a plasma TEOS (tetraethoxysilane) film or an LP-TEOS (low pressure tetraethoxysilane) film) is formed in the grooves by deposition and buried by means of a CMP technique to produce a shallow trench type element isolation layer 351. Note that the $Si_3N_4/SiO_2$ films (not shown) are arranged on the lower electrode 304 in order to protect the surface of the electrode. Care should be taken about the selection of the temperature, the atmosphere and the method to be used for forming the buried insulator film at the time of element isolation in order not to degrade the film quality of layers 303 and 304 serving for the lower electrode.

Then, as in the case of the first embodiment, after removing the pad layer ($Si_3N_4/SiO_2$), a dielectric film of (Ba, Sr) $TiO_3$ is formed on the entire surface for the capacitor insulator film 305 and an upper electrode 306 is formed thereon.

Thereafter, the upper electrode 306 is processed for each memory cell typically by means of ordinary photolithography and plasma etching (e.g., RIE). Note that the components 304, 303 and 302 arranged for the lower electrode are used as plate lines (drive lines) for the FeRAM mode of operation. Then, a silicon nitride film ($Si_3N_4$) 307 is deposited on the entire surface of the upper electrode as stopper film to a thickness of about 40 nm. An oxide film (now shown, which may be an $SiO_2$ film formed by LP-CVD or an application type SOG (spin on grass)) may be formed under the stopper film 305 to prevent any leak current from appearing among the upper electrodes.

Then, an insulator film such as BPSG is stacked on the entire surface to a thickness of about 400 nm and smoothed typically by means of CMP. The subsequent steps are identical with the corresponding steps described above by referring to the first embodiment.

With the above described arrangement and manufacturing method, plate lines are produced to run in parallel with word lines and securely separated from each other to operate for the FeRAM mode of operation. Otherwise, the third embodiment is identical with the first embodiment.

Now, a fourth embodiment of semiconductor memory device according to the invention will be described by referring to FIG. 9.

Figure 9:
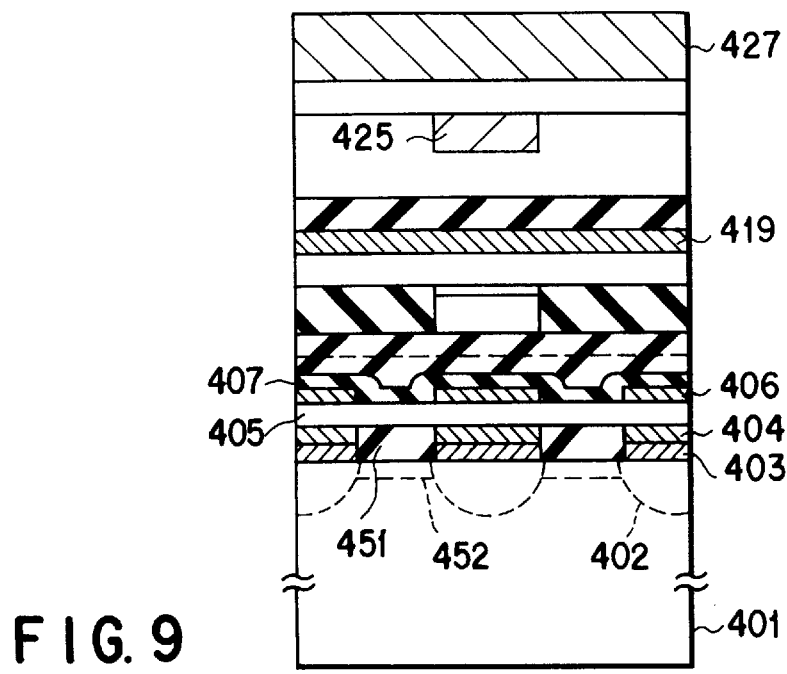
FIG. 9 is a schematic cross sectional view of a fourth embodiment of semiconductor memory device according to the invention.

FIG. 9 is a schematic cross sectional view of the fourth embodiment of semiconductor memory device according to the invention, showing the configuration of the device. Note that the view corresponds to the cross sectional view of the first embodiment taken along arrow line V—V in FIG. 3. Also note that reference symbols 401 through 427 in FIG. 9 respectively denotes the components same as those of FIGS. 4 and 5 denoted by reference symbols 101 through 127.

While the second and third embodiments are described above mainly in terms of the FeRAM mode of operation, the structural and operational features of the plate lines (drive lines) and a method of manufacturing such lines will be stressed in the following description for the fourth embodiment.

Firstly an n+ type diffusion layer 402 is formed into a p-Si substrate 301 by patterning. Then, a TiAlN film and an SrRuO$_3$ film are formed to thicknesses of about 20 nm and about 30 nm for the lower barrier electrode 403 and the lower electrode 404 respectively. The lower barrier electrode 403 and the lower electrode 404 may be formed as in the case of the second embodiment, using the same materials, and may have the same thicknesses respectively.

The lower barrier electrode 403 and the lower electrode 403 operate exactly same as their counterparts of the second embodiment an, therefore if feasible, may be made of a same material. What is important here is to appropriately select materials and film thicknesses for the lower barrier electrode and the lower electrode that do not damage the (100)-orientation of the capacitor dielectric film to be formed in the next step.

Then, an Si$_3$N$_4$/SiO$_2$ films (not shown) are stacked to respective thicknesses of about 50 nm/10 nm as pad film layer on the entire surface. Thereafter, the pad layer (not shown), the lower electrode 404 and the lower barrier electrode 403 are etched by means of photolithography and plasma etching (e.g., RIE) so that the plate lines are formed as a line shape in parallel with the word lines. Then, an anti-inversion layer 452 if formed by implanting ions of a p-type impurity substance (e.g., BF$_2$), typically using the pad film layer and the resist mask for photolithography as mask, in order to prevent the plate electrode from leaking through the Si substrate 401.

Then, an insulator film such as an application type SOG oxide film is formed to fill the gap between the components (403, 404) of the lower electrode and etched back by CMP for smoothing in order to produce a lower electrode separation film 451 out of the insulator film. Then, the Si$_3$N$_4$/SiO$_2$ films are sequentially etched and removed from the surface by means of a wet etching solution (hot phosphoric acid or dilute hydrofluoric acid) in order to expose the surface of the lower electrode 404. The lower electrode separation film 451 and the lower electrode 404 are preferably made flush with each other to show a flat and plane surface at this stage of operation.

Then, as in the he case of the first embodiment, a dielectric film of (Ba, Sr) TiO$_3$ is formed on the entire surface for the capacitor insulator film 405 and an upper electrode 406 is formed thereon.

Thereafter, the upper electrode 406 is processed for each memory cell typically by means of ordinary photolithography and plasma etching (e.g., RIE). Note that the components 404 and 403 arranged for the lower electrode are used as plate lines (drive lines) for the FeRAM mode of operation. Then, a silicon nitride film (Si$_3$N$_4$) 407 is deposited on the entire surface of the upper electrode as stopper film to a thickness of about 40 nm. An oxide film (now shown, which may be an SiO$_2$ film formed by LP-CVD or an application type SOG) may be formed under the stopper film 407 to prevent any leak current from appearing among the upper electrodes.

Then, an insulator film such as BPSG is stacked on the entire surface to a thickness of about 400 nm and smoothed typically by means of CMP. The subsequent steps are identical with the corresponding steps described above by referring to the first embodiment.

With the above described arrangement and manufacturing method, plate lines are produced to run in parallel with word lines and securely separated from each other to operate for the FeRAM mode of operation. The dielectric film 405 requires only smoothing and does not have to be processed from each memory cell so that it may show an enhanced level of reliability. Otherwise, the fourth embodiment is identical with the first embodiment.

Now, a fifth embodiment of semiconductor memory device according to the invention will be described by referring to FIG. 10.

Figure 10:
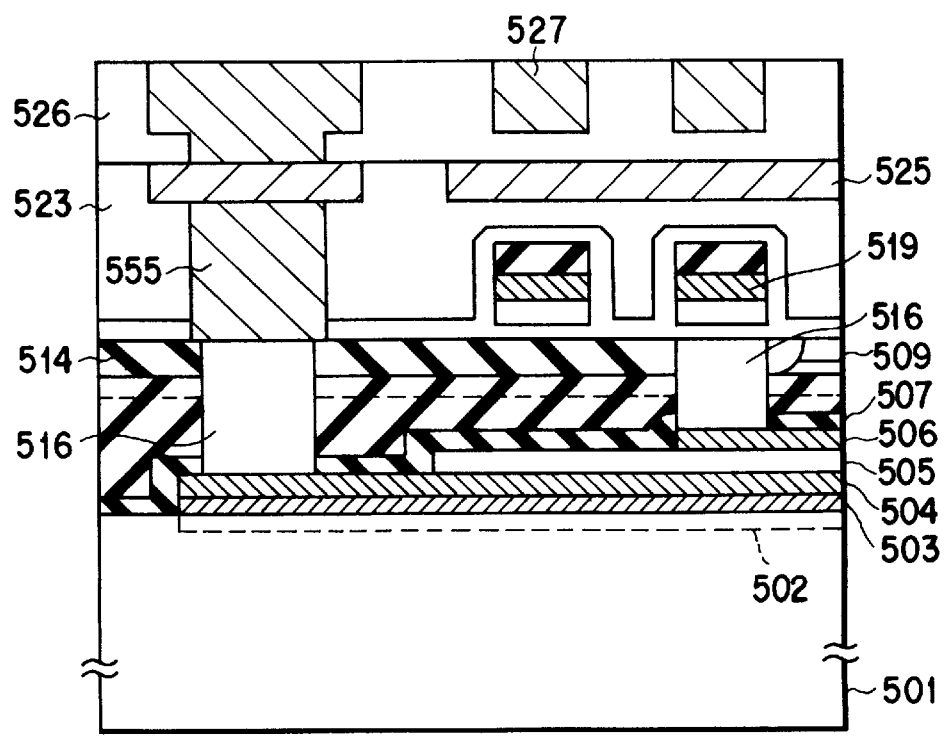
FIG. 10 is a schematic cross sectional view of a fifth embodiment of semiconductor memory device according to the invention.

FIG. 10 is a schematic cross sectional view of the fifth embodiment of semiconductor memory device according to the invention, showing the configuration of the device. Note that the view corresponds to the cross sectional view of the first embodiment taken along arrow line V—V in FIG. 3. Also note that reference symbols 501 through 527 in FIG. 10 respectively denotes the components same as those of FIGS. 4 and 5 denoted by reference symbols 101 through 127.

This fifth embodiment will be described from the view point of how the lower electrode is brought to the surface from under the SOI substrate.

FIG. 10 shows in cross section a region at an end of the memory cell array. The n+ diffusion layer 502 in the p-Si substrate 501, the lower barrier electrode layer 503 (which may typically be a TiAlN film layer with a thickness of about 20 nm) and the lower electrode 504 (which may typically be an SrRuO$_3$ film layer with a thickness of about 30 nm) are formed at the end of the memory cell array to terminate the latter. The dielectric film 505 may also be formed at the end of the memory cell array by means of photolithography and wet etching (using dilute hydrofluoric acid) to terminate the memory cell array after forming the upper electrode.

Thus, after forming the SOI layer 509, there exist a stopper Si$_3$N$_4$ film layer 507, a so-called BOX (bonding oxide) layer that is a clad layer of a smoothing insulator film and an STI element isolation oxide film layer 514 are arranged on the lower electrode 504 in a region held in contact with the electrode 504. Therefore, the lower electrode 504 may well be brought to the surface of the SOI layer by way of the polysilicon layer of the contact hole 516' at the time when the upper electrode 506 is brought to the surface of the SOI layer by way of the polysilicon layer 516 of the contact hole 516.

The above described arrangement and manufacturing method are advantageous because the plate electrode can be connected to the wiring layer on the surface of the device at an end of the memory cell array.

Now, a sixth embodiment of the invention will be described by referring to FIGS. 11A through 13.

FIGS. 11A through 11D are cross sectional views of the sixth embodiment of semiconductor memory device according to the invention in different manufacturing steps.

Firstly, referring to FIG. 11A, an SiO$_2$ film 661 is stacked on a (100)-oriented p-type Si substrate 601 with an impurity concentration of about 1 to 5×10$^{15}$ cm$^{-3}$. Then, an opening is formed in the SiO$_2$ film 661 in an area corresponding to the capacitor forming region by means of photolithography and plasma etching. Thereafter, an n$^+$ diffusion layer 662 is formed in the Si substrate 601 to a depth of about 0.1 µm.

Then, referring to FIG. 11B, the lower barrier electrode 603, the lower electrode (first electrode) 604, the capacitor insulator film 605 and the upper electrode (second electrode) 606 are made to grow sequentially only in the opening of the SiO$_2$ film 602. The lower barrier electrode 603 is an about 10 nm thick TiAlN film and the lower electrode 604 is an about 20 nm thick SrRuO$_3$ film, whereas the capacitor insulator film 605 is an about 30 nm thick (Ba, Sr) TiO$_3$ film and the upper electrode 606 is an about 50 nm thick SrRuO$_3$ film. These film layers are produced in a manner as described above by referring to the first embodiment.

If these layers cannot be made to selectively grow only in the opening, they may alternatively be formed on the entire surface after removing the $SiO_2$ film 661 and then removed in areas other than the capacitor, using the pattern for the diffusion layer. Anyway, what is important here is that the $n^+$ diffusion layer 662 in the Sib completely covers the region where the components 603, 604 of the lower electrode are held in contact with the Si substrate.

Then, referring to FIG. 11C, the $SiO_2$ diffusion layer 661 is removed to expose the surface of the substrate except the region for forming the capacitor.

Referring now to FIG. 11D, the gate electrode 619 is formed on the surface of the substrate with a gate insulator film interposed therebetween and the device is subjected to ion implantation to produce the source/drain diffusion layer 602. As a result of the ion implantation, either the source or the drain of the source/drain diffusion layer 602 of the transistor and the diffusion layer 662 below the capacitor become connected with each other to realize a memory cell. Note that the lower electrode 604 of the capacitor corresponds to the storage electrode and the upper electrode 604 corresponds to the plate electrode of the DRAM.

While not illustrated, a complete DRAM type semiconductor memory device is produced when the capacitor and the oppositely disposed source/drain diffusion layer of the transistor are connected to the upper bit lines and the upper electrodes of the capacitors are commonly connected to an upper wiring layer.

Figure 12A:
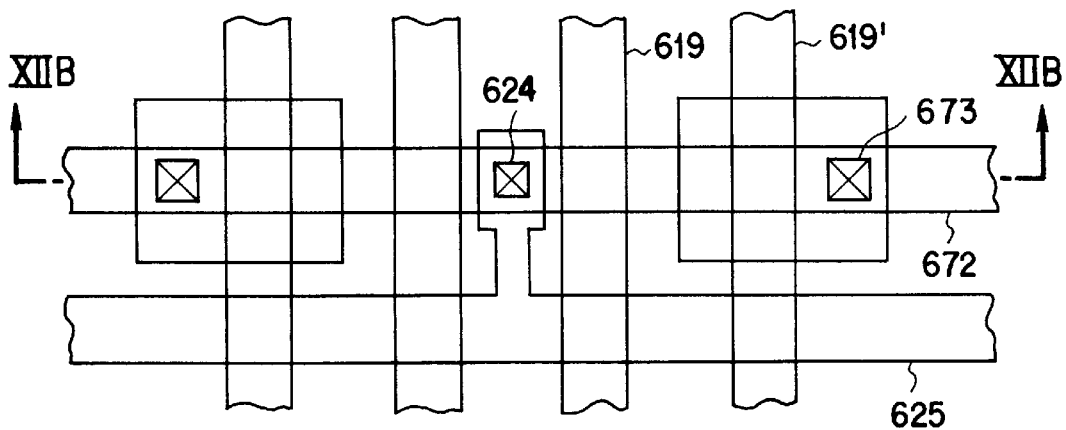
FIGS. 12A and 12B are a schematic plan view and a schematic cross sectional view of a semiconductor memory device that can be obtained by the manufacturing process of FIGS. 11A through 11D.
Figure 12B:
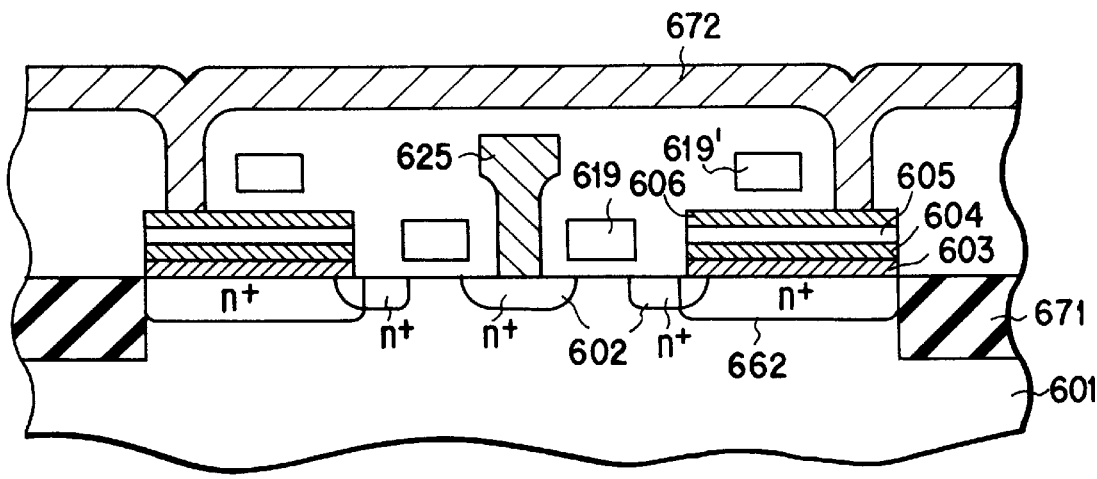

FIGS. 12A and 13B schematically show the configuration of the produced semiconductor memory device. FIG. 12A is a schematic plan view of the device while FIG. 12B is a schematic cross sectional view taken along line XII—XII in FIG. 12A. Reference symbol 671 in FIG. 12B denotes the element isolation insulator film that is buried into the substrate 601 before producing the capacitor. The capacitor and the transistor are produced during the steps in FIGS. 11A through 11D. Reference symbols 625, 624, 672 and 673 denote the bit line, the bit line contact, the plate wiring and the plate contact respectively, whereas reference symbols 619 and 619' denote the word line and the transit word line.

Figure 13:
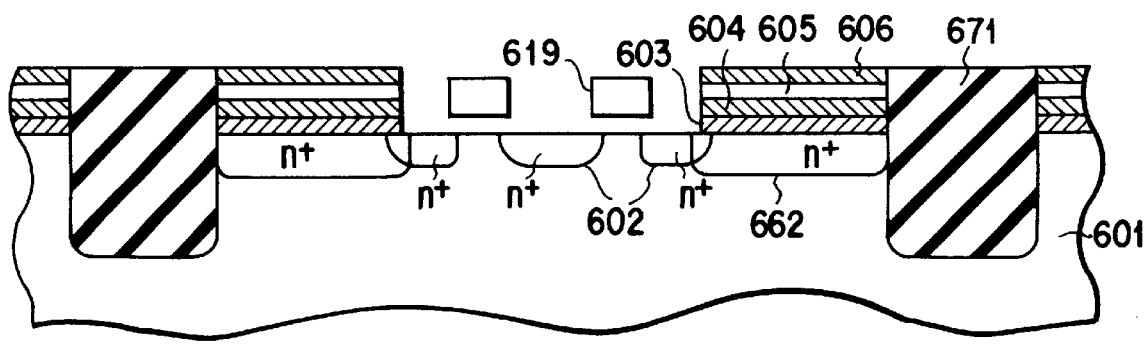
FIG. 13 is a schematic cross sectional view of a semiconductor memory device that can be produced by the manufacturing process of FIGS. 11A through 11D.

FIG. 13 illustrates the arrangement when the operation of element isolation is conducted after forming the capacitor. Note that the element isolation insulator film 671 is buried to make its top surface flush with that of the upper electrode 606. Also note that the bit lines and the plate wiring that are formed above the transistor and the capacitor are omitted in FIG. 13.

Like the first embodiment, the above described sixth embodiment can effectively suppress degradation in the performance of the ferroelectric film (or the high dielectric film) such as an increase in the leak current and the fatigue of the film and variances in the dielectric constant and the polarizability because the ferroelectric film (or the high dielectric film) to be used for the capacitor insulator film 605 can be formed on the flat surface of the Si substrate. Since the underlying substrate 601 is a (100)-oriented substrate, the lower barrier electrode 603 and the lower electrode 604 arranged on the Si substrate 601 can be respectively made of stable TiAlN and $SrRuO_3$ that are lattice-matched with the Si of the substrate and do not damage the (100)-orientation of the dielectric member to be formed thereon.

Additionally, since the (100)-oriented Si substrate carriers thereon a (100)-oriented lower electrode layer and a (100)-oriented dielectric film having an epitaxially grown perovskite, the device can exploit the effect of exploiting the ferroelectricity induced by harnessing the electrodes and boost the relative dielectric constant to bypass the problem of a reduced relative dielectric constant that accompanies a crystalline dielectric material particularly when it is used in a very thin form.

It should be noted that the present invention is by no means limited to the above described embodiments. While a (100)-oriented monocrystalline Si substrate is used for the first substrate in each of the above embodiments, it may alternatively be replaced by any monocrystalline substrate so long as it can grow dielectric film having a perovskite type crystal structure. Likewise, the second substrate can be replaced by a semiconductor other than silicon. For example, a $SrTiO_3$ substrate or a MgO substrate can be used.

While the technique of RIE is used to process the barrier electrode layer (typically made of TiAnN), the lower and upper electrodes (typically made of $SrRuO_3$) and other components and isolate the capacitor in the above description, it may be replaced by some other technique such as ion milling. The dielectric film may be processed with a wet etching technique using an etching solution of hydrofluoric acid or some other etching solution for the purpose of capacitor isolation. The electrodes and the dielectric film may be made of any appropriate materials depending on the specific application of the device.

While the (Ba, Sr) $TiO_3$ film is applied as the dielectric film in each of the first through sixth embodiments, a PZT film or a SBT film may be used.

The semiconductor layer (SOI) formed on the insulator film may not necessarily be clad on the latter. Alternatively, it may be formed by depositing a noncrystalline semiconductor layer on the insulator film and turned into monocrystal by means of an appropriate solid phase growth system. Therefore, changes and modifications may be made to the above described embodiments without departing from the scope of the invention.

As described above in detail, a first electrode, a dielectric film and a second electrode that are monocrystalline are sequentially stacked on a monocrystralline substrate to form a capacitor and a transistor is arranged above the capacitor in each of the first through sixth embodiments so that the underlayer of the electrode of a ferroelectric film (or the high dielectric film) can be smoothed to produce a capacitor insulator film. Thus, the device can effectively suppress degradation in the performance of the ferroelectric film (or the high dielectric film) and allows to realize a higher degree of integration with a simplified manufacturing process.

It will be appreciated that the underlayer of the electrode of a ferroelectric film (or the high dielectric film) can be smoothed to produce a capacitor insulator film by forming the capacitor before the transistor if the transistor and the capacitor are formed on the surface of a same substrate. Therefore, again, the device can effectively suppress degradation in the performance of the ferroelectric film (or the high dielectric film) and allows to realize a higher degree of integration with a simplified manufacturing process.

Now, a seventh embodiment of the invention will be described by referring to FIGS. 14 through 15D.

Figure 14:
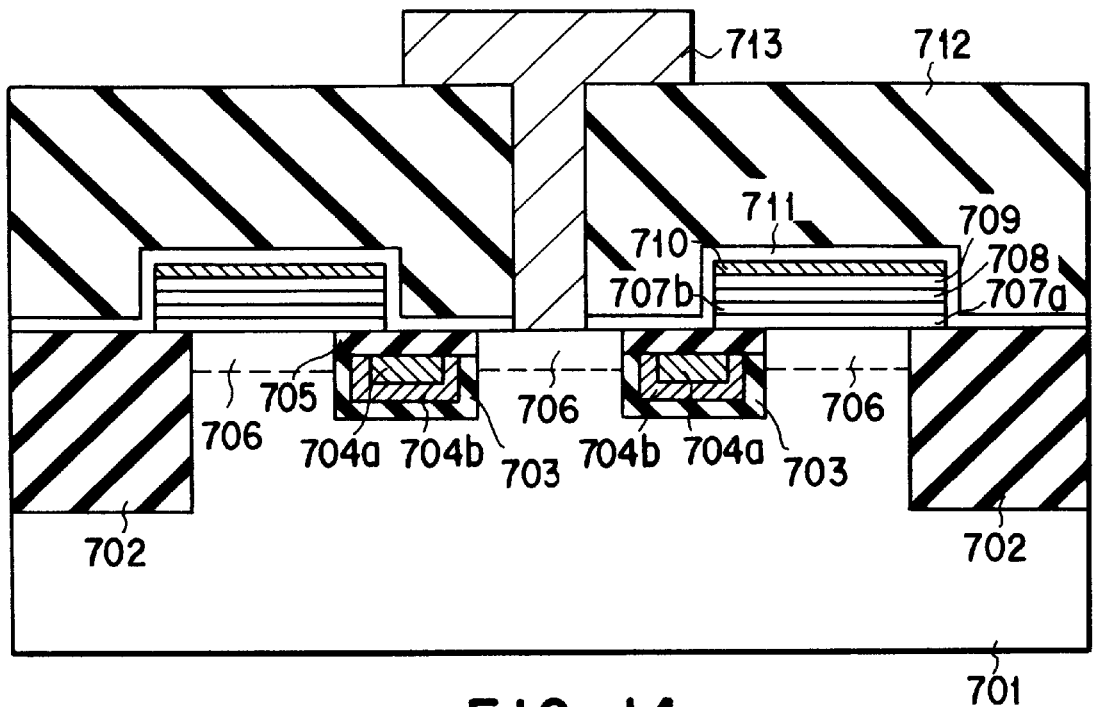
FIG. 14 is a schematic cross sectional view of a seventh embodiment of semiconductor memory device according to the invention.

FIG. 14 is a schematic cross sectional view of the seventh embodiment of semiconductor memory device according to the invention.

An insulator film 702 is buried in a (100)-oriented Si substrate 701 with an impurity concentration between 1 and $5 \times 10^{17}$ $cm^{-8}$ to produce an element isolation region. Additionally, a gate dielectric film ($SiO_2$ film having a film thickness of 6 nm) 703, a gate electrode (comprising a tungsten layer 704a and a titanium nitride layer 704b) 704 and an insulator film (nitride film) 705 are formed in the grooves cut into the Si substrate 701. Then, an n+ diffusion layer 706 is formed and implanted with arsenic (As) ions to a concentration of about $5 \times 10^{15}$ cm$^{-2}$.

As seen from FIG. 14, the top surfaces of the Si substrate 701, the insulator film 702 and the gate insulator film 703 are substantially flush with each other, although they may not necessarily be leveled rigorously and the top surface of the Si substrate 701 may be found slightly above the remaining surfaces.

A buffer layer 707 comprising a TiAlN film 707a and a Pt film 707b is formed on the n+ diffusion layer 706 and then a lower electrode 708 and an SrRuO$_3$ film are formed on the buffer layer 707 by epitaxial growth. Then, (Ba, Sr) TiO$_3$ is made to epitaxially grow thereon to produce a dielectric film 709. An SrRuO$_3$ film is further epitaxially grown on the dielectric film 709 to produce an upper electrode 710.

In FIG. 14, reference symbols 711, 712 and 713 respectively denote a stopper SiO$_2$ film, an interlevel insulator film and a bit line (including a bit line contact).

Now, the process of manufacturing the seventh embodiment of semiconductor memory device will be described by referring to FIGS. 15A through 15D.

Figure 15A:
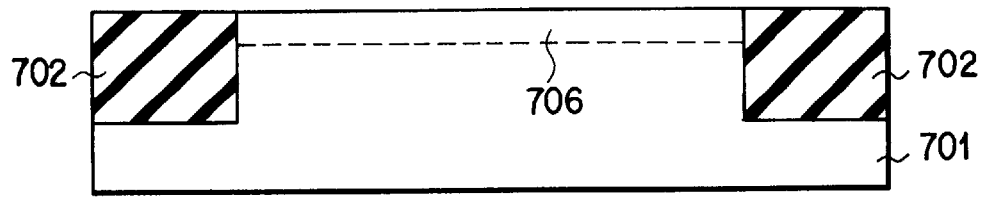
FIGS. 15A through 15D are schematic cross sectional views of the embodiment of FIG. 14, showing the device in different manufacturing steps.

FIG. 15A shows a (100)-oriented p-type Si substrate 701.

Then, an element isolation region 702 is formed. More specifically, a pattern of the element isolation region is formed by using resist (not shown) and a groove is formed in the Si substrate 701 by reactive ion etching, using the resist as mask. Then, a SiO$_2$ film is stacked on the entire surface, which is then smoothed by CMP to leave the SiO$_2$ only in the groove.

Thereafter, a pattern is formed by using resist in order to introduce an impurity. Then, a process of ion implantation is conduced by using the pattern as mask. As+ ions will be implanted with an acceleration voltage of 30 Kev to a dose of about $5 \times 10^{15}$ cm$^{-2}$ for producing an n+-type diffusion layer, whereas BF$_2$+ ions will be implanted with an acceleration voltage of 25 Kev to a dose of about $5 \times 10^{15}$ cm$^{-2}$ for producing a p+-type diffusion layer before the device is heat treated at 1,000° C. for 30 seconds by means of an RTA (rapid thermal annealer) to produce a diffusion layer 706.

Figure 15B:
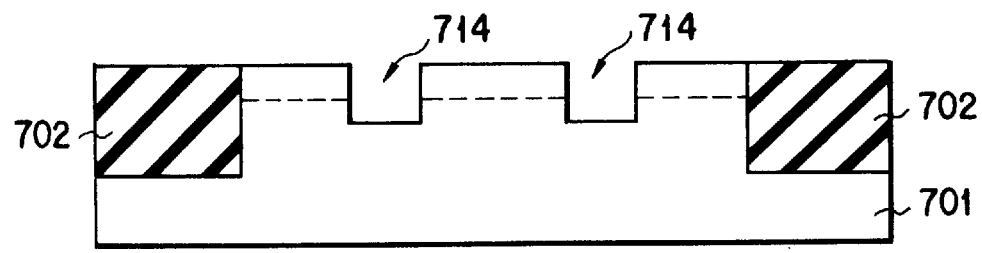

Next, a pattern is formed using resist (not shown) in order to form only a gate electrode portion and a groove 701 is formed in the Si substrate 701 by reactive ion etching, using the resist as mask (FIG. 15B).

Subsequently, an SiO$_2$ film is formed for a gate insulator film 703 to a film thickness of 6 nm by means of a hydrogen gas burning oxidation technique at 750° C. After forming polycrystalline Si film by deposition on the entire surface, a titanium nitride (TiN) film 704b and a tungsten (W) film 704a are stacked to respective thicknesses of 5 nm and 100 nm by CVD to produce a gate electrode 704.

Thereafter, the Si substrate 701 is polished by CMP until the SiO$_2$ layer 703 becomes exposed. After the polishing, the tungsten layer 704a and the titanium nitride layer 704b are etched by 20 nm by reactive ion etching.

Figure 15C:
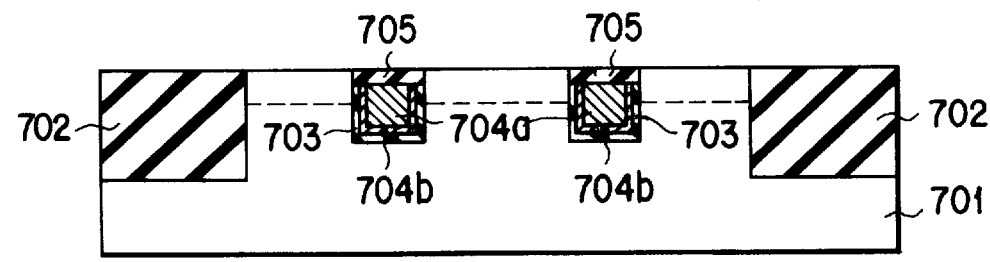
Figure 15D:
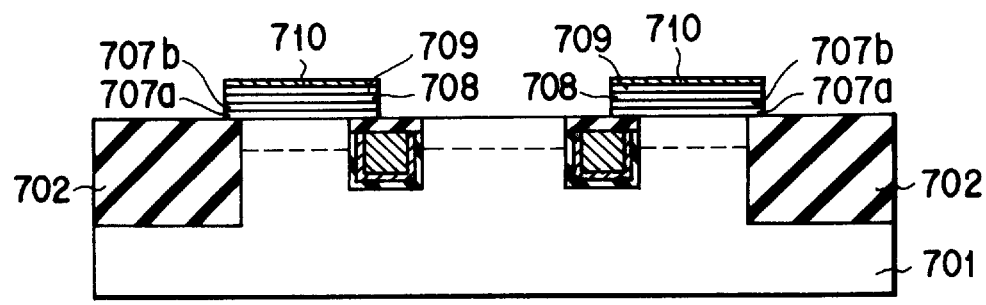

Then, a nitride film 705 is stacked in the etched area by low pressure CVD and the entire surface is polished by CMP until the top surfaces of the Si substrate, the nitride film 705 on the gate electrode 704 and the insulator film 702 of the element isolation region are made substantially flush with each other to produce a transistor (FIG. 15C).

While SiO$_2$ is used for the gate insulator film 703 in the above description, an SiO$_2$ film produced not by oxidation but by CVD may alternatively be used. Still alternatively, an insulator film of nitride (SiN) or Ta$_2$O$_5$ having a large dielectric constant relative to SiO$_2$ may be used.

The materials of the gate electrode are not limited to titanium nitride and tungsten. What counts here is that the materials can safely withstand the thermal process to be conducted after forming the gate electrode. Materials that can be used for the gate electrode include polysilicon Si, certain metals, alloys and metal silicides (such as TiSi$_2$ and CoSi$_2$). A maximum temperature in the processes of forming a BST capacitor is in the range of 650 to 700° C., within which a BST crystallizing process is executed. Therefore, any material can be used for forming the gate electrode as long as it does not react with the gate oxide film or coagulate at the maximum temperature.

The insulator film stacked on the gate electrode 704 may not necessarily be made of SiN. It may alternatively be made of an appropriate material that can be used to selectively dry-etch the interlevel insulator film 712 (silicon oxide film or BPSG) to be formed thereon.

Now, returning to the process of manufacturing the seventh embodiment of semiconductor memory device, the description will be resumed by referring to FIG. 15C and on.

A buffer layer 707 and a lower electrode 708 are formed on the Si substrate 701 as shown in FIG. 15C. More specifically, a titanium aluminum nitride (TiAlN) film 707a and a Pt film 707b are sequentially formed to respective thicknesses of about 10 nm and 20 nm and then an SrRuO$_3$ film 708 is formed further thereon to a thickness of about 20 nm all by sputtering. A mixture gas of Ar and nitrogen is used for depositing the TiAlN film 701 and only Ar is used for depositing the Pt film, whereas a mixture gas of Ar and oxygen is used to deposit the SrRuO$_3$ film. Of course, these film layers may be formed by evaporation of CVD in place of sputtering.

Thereafter, a (Ba, Sr) TiO$_3$ film is formed to a thickness of about 20 nm by sputtering to produce a dielectric film layer 709, using a mixture gas of Ar and oxygen and heating the substrate to about 600° C. Then, another SrRuO$_3$ film is formed to a thickness of about 20 nm by sputtering to produce an upper electrode 710. Theses films are made to epitaxially grow under the influence of the Si crystal. Note that it is necessary to make sure in advance typically by means of X-ray diffractometry that the dielectric film 709 is a monocrystalline film.

The TiAlN layer 707a and the Pt layer 707b are used as buffer layers necessary for epitaxially growing the SrRuO$_3$ layer having a lattice constant that does not match with that of silicon. In other words, they may be replaced by layers of some other materials having a lattice constant found between those of Si and SrRuO$_3$. Materials that can be used for those layers include nickel silicate, cobalt silicate, titanium nitride and tungsten nitride. Note that two layers do not necessarily have to be used and three layers may be used as buffer layers for the purpose of the invention. What counts here is that they can buffer the sharp transition from the lattice constant of Si to that of SrRuO$_3$ and the method of buffering the transition for the purpose of the invention is not limited to the above described one.

Then, a capacitor is produced by ordinary photolithography and reactive ion etching. The etching gas used in this step contains Cl$_2$ as a principal ingredient, to which Ar is added to make the hardly volatile compound to operate effectively for sputtering. Fluorine compound gas such as CF$_4$ may be added to a small extent. The resist is peeled off by means of an oxygen ashing system after the completion of the etching step (FIG. 15D).

Thereafter, an SiO$_2$ film 711 is stacked to a film thickness of 20 nm at 700° C. by CVD using tetraethoxysilane (TEOS) and another SiO$_2$ film layer (BPSG) 712 containing boron (B) and phosphor (P) is stacked thereon. Then, the entire surface is smoothed by CMP.

Then, a contact hole which is referred to as bit line contact is formed by photolithography and reactive ion etching.

Subsequently, a bit line 713 is formed by depositing tungsten and $WF_6$ gas on the entire surface by CVD at 400° C. and processing the deposited film by means of reactive ion etching using a mixture gas of $SF_6$ and chlorine gas. A complete semiconductor memory device as shown in FIG. 14 is produced at this stage.

With the seventh embodiment of semiconductor memory device according to the invention, a capacitor that is adapted to epitaxially grow can be produced with ease since the device is smoothed after forming a transistor to expose the surface of the monocrystalline Si substrate so that the device can effectively suppress degradation in the performance of the ferroelectric film (or the high dielectric film). Additionally, the embodiment can be manufactured with a process that is substantially similar to the process of manufacturing ordinary memory cells.

Now, an eighth embodiment of semiconductor memory device according to the invention will be described by referring to FIGS. 16 through 17E.

Figure 16:
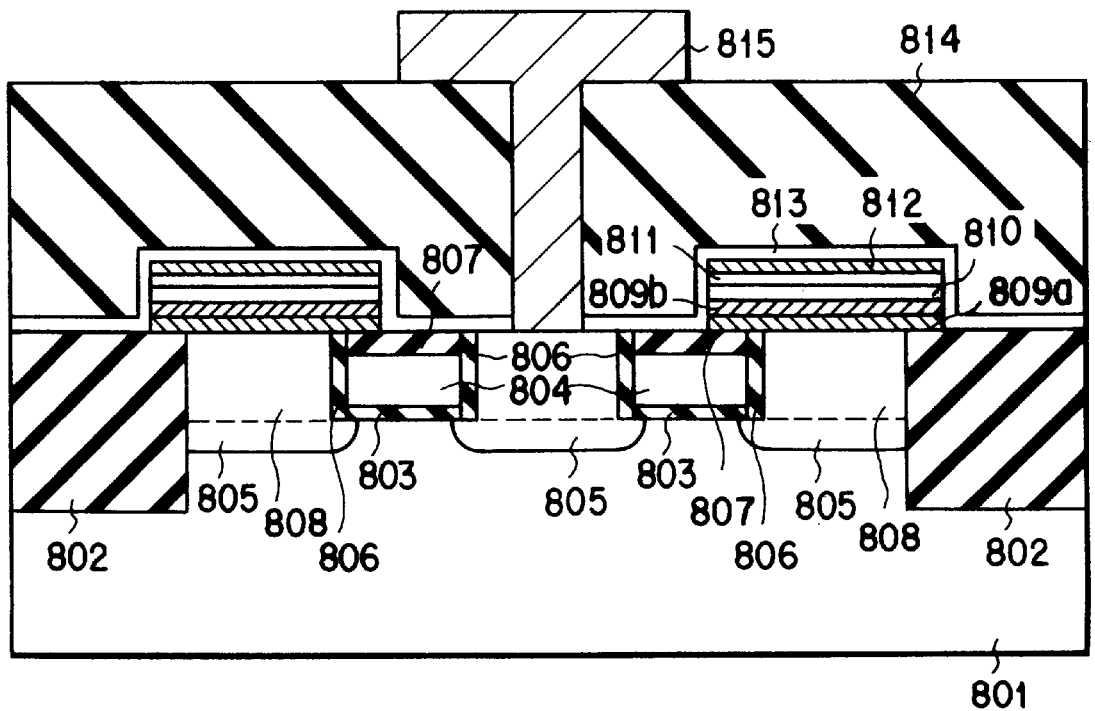
FIG. 16 is a schematic cross sectional view of an eighth embodiment of semiconductor memory device according to the invention.

FIG. 16 is a schematic cross sectional view of the eighth embodiment.

An element isolation region 802 is formed in a (100)-oriented monocrystalline Si substrate 801. A gate insulator film 803, a gate electrode 804 and a diffusion layer 805 are also formed on the substrate 801. Insulator films 806 and 807 are arranged respectively on the lateral and upper surfaces of the gate electrode 804. Reference symbol 808 denotes an epitaxially grown Si layer.

A buffer layer 809 (809a, 809b), a lower electrode 810, a dielectric film 811, an upper electrode 812 are sequentially formed on the transistor to produce a capacitor. The buffer layer 809 comprises a TiAlN film 809a and a Pt film 809b. Both the lower electrode 810 and the upper electrode 812 are made of $SrRuO_3$ and the dielectric film 811 is made of epitaxially grown $(Ba, Sr) TiO_3$.

Then, a stopper film 813, an interlevel insulator film 814 and a bit line (including a bit line contact) are formed on the capacitor.

Now, the process of manufacturing the eighth embodiment of semiconductor memory device will be described by referring to FIGS. 17A through 17E.

Figure 17A:
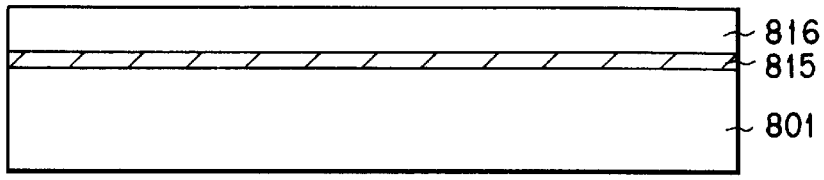
FIGS. 17A through 17E are schematic cross sectional views of the embodiment of FIG. 16, showing the device in different manufacturing steps.

Firstly, there is shown a p-type (100)-oriented Si substrate in FIG. 17A. Then, a 10 nm thick $SiO_2$ film 815 is formed on the substrate 801 by thermal oxidation and thereafter a silicon nitride film 816 is stacked on it to a thickness of 150 nm by means of CVD using $SiH_2Cl_2$ and ammonium.

Figure 17B:
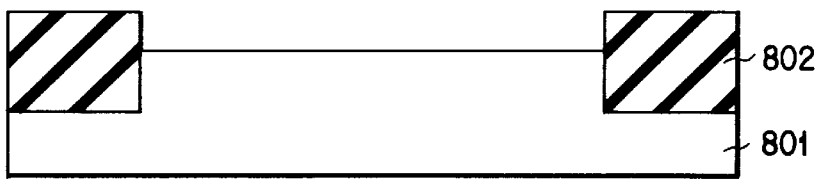

Then, the thermal oxidation film 815, the SiN film 816 and the Si substrate 801 are etched to produce a groove in the Si substrate by ordinary photolithography and reactive ion etching. The groove is then filled with an oxide film by CVD at about 420° C. using TEOS and ozone. Then, the surface is smoothed by CMP to produce an element isolation region 802. Thereafter, the $SiO_2$ film 815 and the nitride film 816b are removed by means of hot phosphoric acid and diluted hydrofluoric acid (FIG. 17B).

Then, a gate insulator film 803 is formed on the Si substrate 801 by hydrogen gas burning oxidation at 750° C. and a polycrystalline Si layer is formed to a thickness of 100 nm by CVD for the gate electrode 804, into which phosphor is diffused at 905° C. for 20 minutes by using POCL3. Additionally, a silicon nitride film 807 is stacked on the polycrystalline Si layer to a thickness of 50 nm by CVD using $SiH_2Cl_2$ and ammonium. Then, the nitride film 807 and the polycrystalline Si are etched by means of photolithography and reactive ion etching. The etching gas used in this etching operation contains HBr as principal ingredient.

Figure 17C:
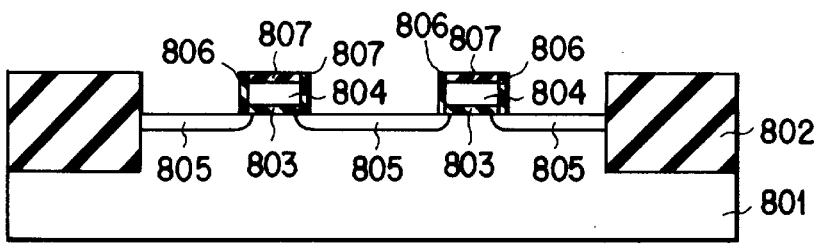

Then, a resist mask (not shown) is prepared and the device is subjected to impurity ion implantation, using the mask, to produce a so-called extension area. Thereafter, a nitride film 806 is stacked to a thickness of 10 nm and etched out by reactive ion etching using $C_4F_8$, leaving the film only on the lateral side walls of the gate electrode. Then, a diffusion layer 805 is formed by deep ion implantation (FIG. 17C).

Subsequently, Si is epitaxially grown at 1,000° C. by means of $SiH_4$, to which a doping gas typically containing $PH_5$ is added to produce a doped epitaxial film. Note that, while monocrystalline Si is epitaxially grown on the diffusion layer 805, polycrystalline Si is grown on the nitride film 807 arranged on the gate electrode and also on the element isolation region 802.

This step may alternatively be conducted by depositing amorphous Si film at 550° C. using a doping gas typically containing $Si_2H_6$ and $PH_5$ and thermally treating the film at about 650° C. for crystallization. When amorphous Si is crystallized, the crystallized Si will be monocrystalline at least on the diffusion layer as it is epitaxially grown under the influence of the bearing of the diffusion layer 805.

Figure 1:
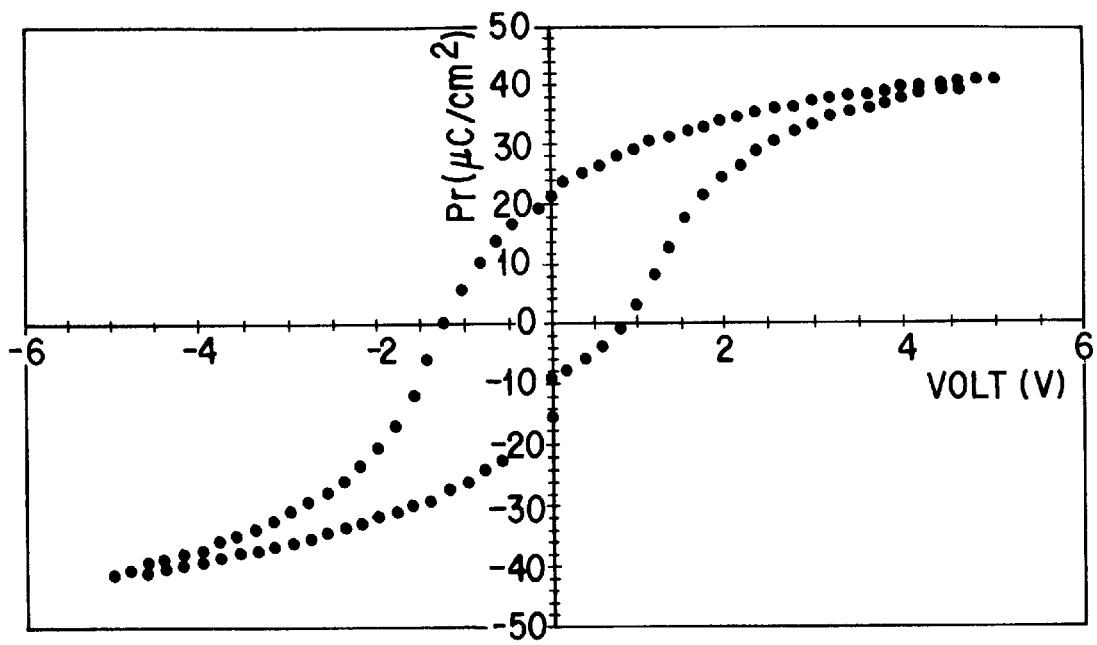
FIG. 1 is a graph showing the hysteresis characteristics of a ferroelectric memory device, illustrating its operation.
Figure 2:
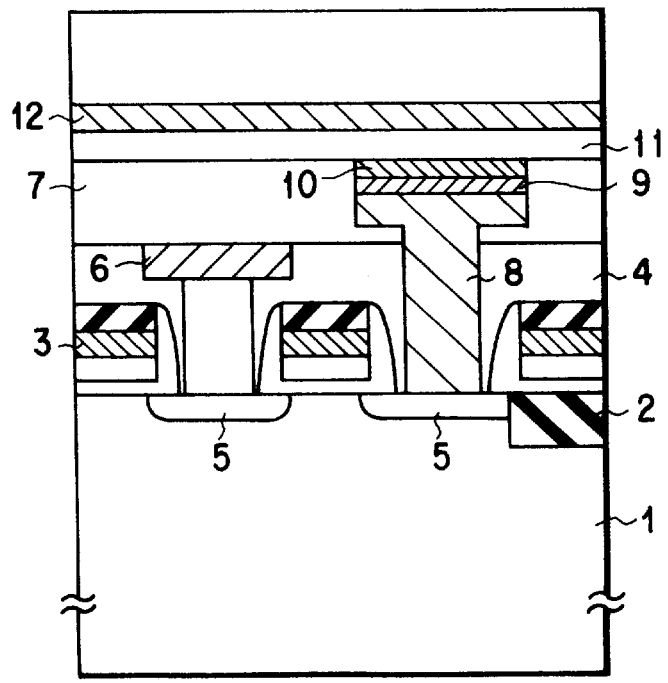
FIG. 2 is a schematic cross sectional view of a know semiconductor memory device having a COB (capacitor over bit line) structure.

It should be noted that the epitaxial growth of silicon can be realized much easier to produce a high quality epitaxial film in this embodiment than in the known device of FIG. 2 because the epitaxially grown silicon film may well have a thickness substantially equal to the height of the gate electrode (or about 150 to 200 nm).

Figure 17D:
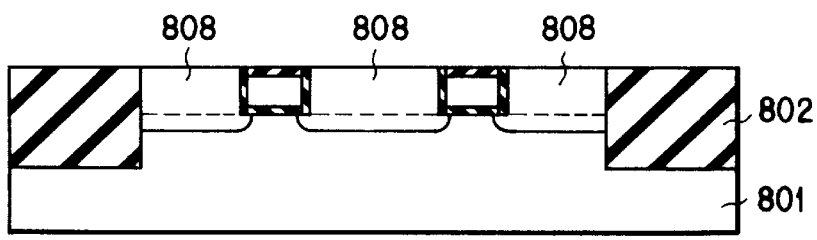

Then, any unnecessary areas of the device is removed by CMP to make the top surfaces of the element isolation region 802, the epitaxial region 808 and the nitride film 807 on the gate electrode are flush with each other (FIG. 17D). Note that this smoothing operation is performed to achieve the effect as described earlier by referring to the seventh embodiment and hence the element isolation region 802, the epitaxial region 808 and the nitride film 807 on the gate electrode do not have to be made perfectly flush with each other if the above identified effect is achieved.

Then, a titanium aluminum nitride (TiAlN) film 809a and a Pt film 809b are formed to a thickness of about 10 nm as a buffer layer 809 on the substrate 801, which is now carrying thereon a transistor, and an $SrRuO_3$ film is formed to a thickness of about 20 nm as a lower electrode 810. Sputtering may typically be used to produce these films under the conditions as described above by referring to the seventh embodiment, although evaporation or CVD may alternatively be used.

Then, a dielectric film $((Ba, Sr)TiO_3)$ 811 is formed to a film thickness of about 20 nm also by sputtering. Thereafter, another $SrRuO_3$ film is formed to a film thickness of about 20 nm by sputtering as an upper electrode 812. The substrate is heated to about 600° C. and a mixture gas of Ar and oxygen is used for the sputtering operation for forming these films. The films epitaxially grow under the influence of the Si crystal of the substrate.

Note that the TiAlN film 809a and the Pt film 809b operate as buffer layers for epitaxially growing the $SrRuO_3$ film that does not match with the Si substrate in terms of lattice constant. This means that other materials may alternatively be used for the buffer layers if they show a lattice constant found between those of Si and $SrRuO_3$. Materials that can be used for the buffer layers include nickel silicate, cobalt silicate, titanium nitride and tungsten nitride. Note that two layers do not necessarily have to be used and three layers may be used as buffer layers for the purpose of the invention as described earlier by referring to the seventh embodiment.

Figure 17E:
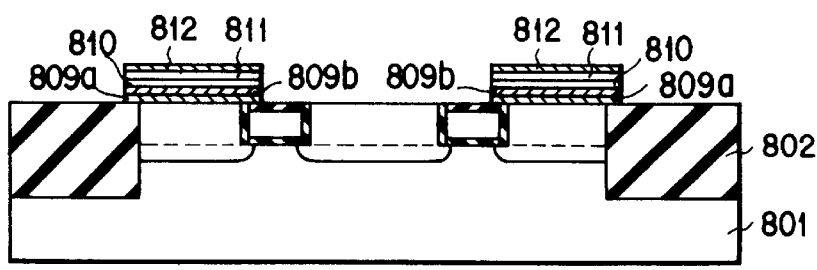

Then, a capacitor is produced by ordinary photolithography and reactive ion etching (FIG. 17E). Thereafter, an $SiO^2$ film 813 containing no dopant is stacked to a film thickness of 20 nm C by CVD using tetraethoxysilane (TEOS) and another $SiO_2$ film layer (BPSG) 814 containing boron (B) and phosphor (P) is stacked thereon to a film thickness of 400 nm. Then, the entire surface is smoothed by CMP.

Then, a contact hole which is referred to as bit line contact is formed by photolithography and reactive ion etching. Subsequently, a bit line 815 is formed by depositing tungsten on the entire surface by CVD and processing the deposited film. A complete semiconductor memory device as shown in FIG. 17 is produced at this stage.

With the eighth embodiment of semiconductor memory device according to the invention, a capacitor that is adapted to epitaxialially grow can be produced with ease since the device is smoothed after forming a transistor to expose the surface of the monocrystalline Si substrate so that the device can effectively suppress degradation in the performance of the ferroelectric film (or the high dielectric film). Additionally, the embodiment can be manufactured with a process that is substantially similar to the process of manufacturing ordinary memory cells.

With the above described seventh and eighth embodiments, an epitaxial capacitor can be formed with ease because the surface of the monocrystalline Si substrate is exposed after forming a transistor and smoothing the surface of the device.

Additionally, a capacitor that is adapted to epitaxially grow can be produced with ease since the device is smoothed after forming a transistor to expose the surface of the monocrystalline Si substrate so that the device can effectively suppress degradation in the performance of the ferroelectric film (or the high dielectric film) and allows to realize a higher degree of integration with a simplified manufacturing process.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor element comprising:
    a semiconductor section carrying a transistor formed therein; and
    a capacitor section having a capacitor,
    wherein the capacitor includes epitaxially grown first and second electrodes, and an epitaxially grown dielectric film is arranged between the first and second electrodes,
    also wherein the transistor and the capacitor form a memory cell, a first electrode and a second electrode are sequentially stacked above a monocrystalline substrate to produce a multilayer structure, the transistor is formed on the capacitor with an insulation layer interposed therebetween, and either a source or a drain of the transistor is connected to the second electrode by way of a contact hole formed through the insulation layer,
    further wherein the first electrode is made of an electroconductive material having a crystal structure with a tetragonal system type (100)-plane and the dielectric film has a tetragonal system type perovskite crystal structure.

2. A semiconductor memory device according to claim 1, wherein the monocrystalline substrate is made of (100)-oriented silicon.

3. A semiconductor memory device according to claim 1, wherein the dielectric film is highly dielectric at room temperature.

4. A semiconductor memory device according to claim 1, wherein the dielectric film is ferroelectric at room temperature.

5. A semiconductor memory device according to claim 1 and comprising a plurality of memory cells, wherein the first electrode operates as a common plate electrode adapted to provide a common electric potential to the plurality of memory cells and the second electrode operates independently for each of the memory cells.

6. A semiconductor memory device according to claim 1 and comprising a plurality of memory cells, wherein the dielectric film is ferroelectric at room temperature and the first electrode is formed as a common plate electrode adapted to provide a common electric potential to the plurality of memory cells and the second electrode is formed independently for each of the memory cells.

7. A semiconductor memory device according to claim 1, wherein the capacitor has a barrier layer having a lattice constant close to that of Si between the first electrode and the monocrystalline substrate.

8. A semiconductor element comprising:
    a semiconductor section carrying a transistor formed therein; and
    a capacitor section having a capacitor,
    wherein the capacitor includes epitaxially grown first and second electrodes, and an epitaxially grown dielectric film arranged between the first and second electrodes;
    also wherein the transistor section includes an element isolation region, an insulator film formed on a gate electrode of the transistor and an epitaxially grown monocrystalline Si section;
    the top surface of the monocrystalline Si section being substantially level with those of the element isolation region and the insulator film;
    the capacitor section having a buffer layer epitaxially grown on the monocrystalline Si section, the first electrode, the dielectric film and the second electrode being sequentially stacked on the buffer layer;
    further wherein the first electrode is made of an eletroconductive material having a crystal structure with a tetragonal system type (100)-plane and the dielectric film has a tetragonal system type perovskite crystal structure.

9. A semiconductor memory device according to claim 8, wherein the dielectric film is highly dielectric at room temperature.

10. A semiconductor memory device according to claim 8, wherein the dielectric film is ferroelectric at room temperature.

11. A semiconductor memory device according to claim 8, where the dielectric film has is a monocrystalline film of a perovskite type oxide containing Ba, Sr, Ti and oxygen.

12. A semiconductor memory device according to claim 8, wherein the buffer layer is made of an electroconductive material having a lattice constant close to that of silicon and the first electrode is made of an electroconductive oxide having a perovskite crystal structure.

13. A semiconductor memory device according to claim 8, wherein the buffer layer has a double-layered structure of a TiAlN film and a Pt film and the first electrode is made of $SrRuO_3$, whereas the dielectric film is made of $Ba_xSr_{1-x}TiO_3$ (0.1<x<0.9).

14. A semiconductor memory device according to claim 8, wherein the buffer layer has a double-layered structure of a TiAlN film and a Pt film and the first electrode is made of $SrRuO_3$, whereas the dielectric film is made of $Ba_xSr_{1-x}TiO_3$ (0.1<x<0.9) and the second electrode is made of $SrRuO_3$.

* * * * *